(12) United States Patent
Gribok et al.

(10) Patent No.: US 7,656,340 B2
(45) Date of Patent: Feb. 2, 2010

(54) SYSTEMS AND METHODS FOR PIPELINED ANALOG TO DIGITAL CONVERSION

(75) Inventors: Sergey Gribok, San Jose, CA (US); Choshu Ito, San Mateo, CA (US); William Loh, Fremont, CA (US); Erik Chmelar, Midland, MI (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 12/134,523

(22) Filed: Jun. 6, 2008

(65) Prior Publication Data

US 2009/0303093 A1   Dec. 10, 2009

(51) Int. Cl.
*H03M 1/38* (2006.01)
(52) U.S. Cl. .................................. 341/161; 341/155
(58) Field of Classification Search ................. 341/155, 341/141, 161
See application file for complete search history.

(56) References Cited

U.S. PATENT DOCUMENTS

| | | | | |
|---|---|---|---|---|
| 5,072,221 A * | 12/1991 | Schmidt | ........................ | 341/159 |
| 5,272,701 A * | 12/1993 | Tsuruoka | ........................ | 370/252 |
| 5,296,856 A | 3/1994 | Mantong | | |
| 5,861,829 A | 1/1999 | Sutardja | | |
| 6,002,356 A | 12/1999 | Cooper | | |
| 6,081,219 A | 6/2000 | Prasanna | | |
| 6,373,423 B1 | 4/2002 | Knudsen | | |
| 6,404,372 B1 | 6/2002 | Heithoff | | |
| 6,717,945 B1 * | 4/2004 | Jue et al. | ........................ | 370/392 |
| 6,744,432 B1 * | 6/2004 | Morein | ........................ | 345/422 |
| 6,816,101 B2 * | 11/2004 | Hietala et al. | ........................ | 341/155 |
| 7,262,724 B2 | 8/2007 | Hughes et al. | | |
| 7,333,580 B2 | 2/2008 | Parhi | | |
| 2002/0186776 A1 | 12/2002 | Cosand | | |
| 2008/0048896 A1 | 2/2008 | Parthasarthy et al. | | |

OTHER PUBLICATIONS

Mangelsdorf, C.W., "A 400-MHz input flash converter with error correction", IEEE Journal of Solid-State Circuits, pp. 184 - 191, Feb. 1990, vol. 25 Issue: 1.
Katsuria, S. et. al., "Techniques for High-Speed Implementation of Nonlinear Cancellation", IEEE Joun. Communications, vol. 9, No. 5, Jun. 1991, pp. 711-717.

* cited by examiner

*Primary Examiner*—Peguy JeanPierre
(74) *Attorney, Agent, or Firm*—Hamilton, DeSanctis & Cha

(57) ABSTRACT

Various embodiments of the present invention provide systems and methods for analog to digital conversion. For example, a pipelined analog to digital converter is disclosed that includes two or more comparators. A first of the comparators is operable to compare an analog input to a first voltage reference upon assertion of the first clock, and a second of the comparators is operable to compare the analog input to a second voltage reference upon assertion of the second clock. The pipelined analog to digital converters further include a multiplexer tree with at least a first tier multiplexer and a second tier multiplexer. The first tier multiplexer receives an output of the first comparator and an output of the second comparator, and the second tier multiplexer receives an output derived from the first tier multiplexer. The second tier multiplexer provides an output bit. A bit enable set is used as a selector input to the first tier multiplexer and the second tier multiplexer, and the bit enable set includes one or more output bits from preceding bit periods.

20 Claims, 15 Drawing Sheets

SYSTEMS AND METHODS FOR PIPELINED ANALOG TO DIGITAL CONVERSION

BACKGROUND OF THE INVENTION

The present inventions are related to systems and methods for processing digital signals, and more particularly to systems and methods for analog to digital conversion.

Analog to digital converters are used in a number of semiconductor devices to convert an analog electrical signal to a digital representation thereof. In the conversion process, a continuous analog signal is converted to a series of discrete or quantized digital values representing the analog signal at defined sample times. Simple analog to digital converters operate over a specified, static range of operation typically defined to encompass an expected analog input signal. FIG. 1 depicts an exemplary prior art flash analog to digital converter 100. Flash analog to digital converter 100 includes a comparator bank 120 including a number of comparators 121, 122, 123, 124, 125 that each receives a respective reference threshold (i.e., ref(n−1), ref(n−2), ref(3), ref(2) and ref(1)). In addition, each of comparators 121, 122, 123, 124, 125 receives an analog input 105, and compares analog input 105 to the respective reference threshold. The reference thresholds are chosen such that the combined output of comparator bank 120 is a thermometer code indicated as a digital output 170. When operating properly, digital output 170 includes an uninterrupted series of 0's followed by an uninterrupted series of 1 s with the transition between 0 s and 1 s indicating the level of analog input 105 (i.e., a thermometer code without bubbles). In some cases, digital output 170 is provided to an encoder 180 that provides an encoded output 190 that may be more compact than a thermometer code.

In such a flash analog to digital converter, increased resolution is provided by reducing the level difference between successive reference voltages. Where the range of analog to digital converter 100 is to be maintained constant, increasing resolution requires a corresponding increase in the number of comparators. This has at least two disadvantages. First, additional comparators increase power and area consumption. Second, noise on analog input 105 and process differences in comparators 121, 122, 123, 124, 125 often results in production of an imperfect thermometer code (i.e., a thermometer code exhibiting bubbles) where the difference between successive reference voltages becomes small. Consequently, to compensate for the imperfections in the thermometer code, the complexity of encoder 180 increases substantially. This results in additional undesirable power and area costs.

Hence, for at least the aforementioned reasons, there exists a need in the art for advanced systems and methods for analog to digital conversion.

BRIEF SUMMARY OF THE INVENTION

The present inventions are related to systems and methods for processing digital signals, and more particularly to systems and methods for analog to digital conversion.

Various embodiments of the present invention provide pipelined analog to digital converters that include two or more comparators. A first of the comparators is operable to compare an analog input to a first voltage reference upon assertion of the first clock, and a second of the comparators is operable to compare the analog input to a second voltage reference upon assertion of the second clock. The pipelined analog to digital converters further include a multiplexer tree with at least a first tier multiplexer and a second tier multiplexer. The first tier multiplexer receives an output of the first comparator and an output of the second comparator, and the second tier multiplexer receives an output derived from the first tier multiplexer. The second tier multiplexer provides an output bit. A bit enable set is used as a selector input to the first tier multiplexer and the second tier multiplexer, and the bit enable set includes one or more output bits from preceding bit periods.

Other embodiments of the present invention provide communication systems with a receiver, a transmitter and a transfer medium. The receiver includes a pipelined analog to digital converter with two or more comparators. A first of the comparators is operable to compare an analog input to a first voltage reference upon assertion of the first clock, and a second of the comparators is operable to compare the analog input to a second voltage reference upon assertion of the second clock. The pipelined analog to digital converters further include a multiplexer tree with at least a first tier multiplexer and a second tier multiplexer. The first tier multiplexer receives an output of the first comparator and an output of the second comparator, and the second tier multiplexer receives an output derived from the first tier multiplexer. The second tier multiplexer provides an output bit. A bit enable set is used as a selector input to the first tier multiplexer and the second tier multiplexer, and the bit enable set includes one or more output bits from preceding bit periods. In some cases, the communication system is a hard disk drive system, and the medium is a storage medium. In other cases, the communication system is a wireless communication system, and the medium is a wireless medium.

Yet other embodiments of the present invention provide methods for analog to digital conversion using a plurality of comparators, where each of the plurality of comparators receives an analog input signal and a respective reference voltage. The methods include receiving the analog input signal, and selecting an output bit of a respective one of the plurality of comparators using a synchronized multiplexer tree. The synchronized multiplexer tree includes at least a first tier multiplexer and a second tier multiplexer. The first tier multiplexer receives outputs from each of the plurality of comparators. A register receives outputs from the first tier multiplexer, and the second tier multiplexer receives an output derived from the register. The second tier multiplexer provides the output bit for a current bit period. Selection of the output bit is based at least in part on the output bit from a preceding bit period. In some instances of the aforementioned embodiments, the output bit from the preceding bit period is used to enable a subset of the plurality of comparators. Further, in some cases, the subset of the plurality of comparators is selected from one of the following: one half of the subset of comparators, one quarter of the subset of comparators, or less than one quarter of the subset of comparators. In some cases, the first tier multiplexer is a first multi-tier multiplexer, and the second tier multiplexer is a second multi-tier multiplexer.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 3b is a timing diagram depicting an exemplary operation of the dynamic analog to digital converter of FIG. 3a;

DETAILED DESCRIPTION OF THE INVENTION

The present inventions are related to systems and methods for processing digital signals, and more particularly to systems and methods for analog to digital conversion.

Figure 2A:
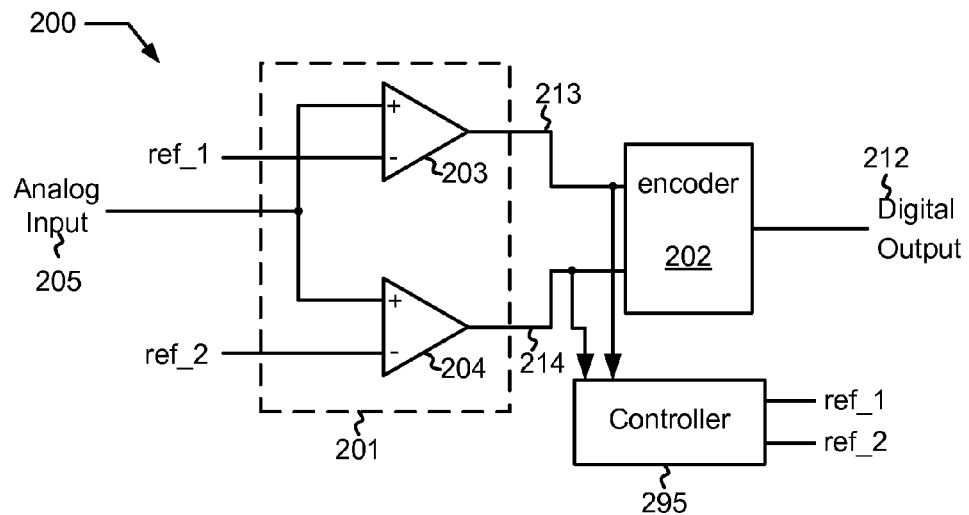
FIG. 2a depicts a dynamic analog to digital converter that may be used in relation to different embodiments of the present invention.

Turning to FIG. 2a, a dynamic analog to digital converter 200 that may be used in relation to one or more embodiments of the present invention is depicted. Dynamic analog to digital converter 200 is described in greater detail in U.S. patent application Ser. No. 12/108,791 entitled "Analog-To-Digital Converter" and filed Apr. 24, 2008 by Chmelar et al. The aforementioned application is incorporated herein by reference for all purposes. Dynamic analog to digital converter 200 includes a comparator bank 201 with an upper comparator 203 and a lower comparator 204. An upper voltage reference (ref_1) and an analog input 205 are compared by upper comparator 203 resulting in a binary output 213, and a lower voltage reference (ref_2) and analog input 205 are compared by lower comparator 204 resulting in a binary output 214. Output 213 and output 214 are provided to an encoder 202 that in turn provides a digital output 212. As described below in relation to FIG. 2b, a controller 295 dynamically adjusts ref_1 and ref_2 to track analog input 205 based on outputs 213, 214. The following pseudocode represents the operation of comparator bank 201:

```
If ((Output 213='1') && (Output 214='1'))
{
ref_1=ref_1−step;
ref_2=ref_2−step
}
Else If ((Output 213='0') && Output 214='1'))
{
ref_1=ref_1;
ref_2=ref_2
}
Else If ((Output 213='0') && Output 214 '0'))
{
ref_1=ref_1+step;
ref_2=ref_2+step
}
```

Figure 2B:
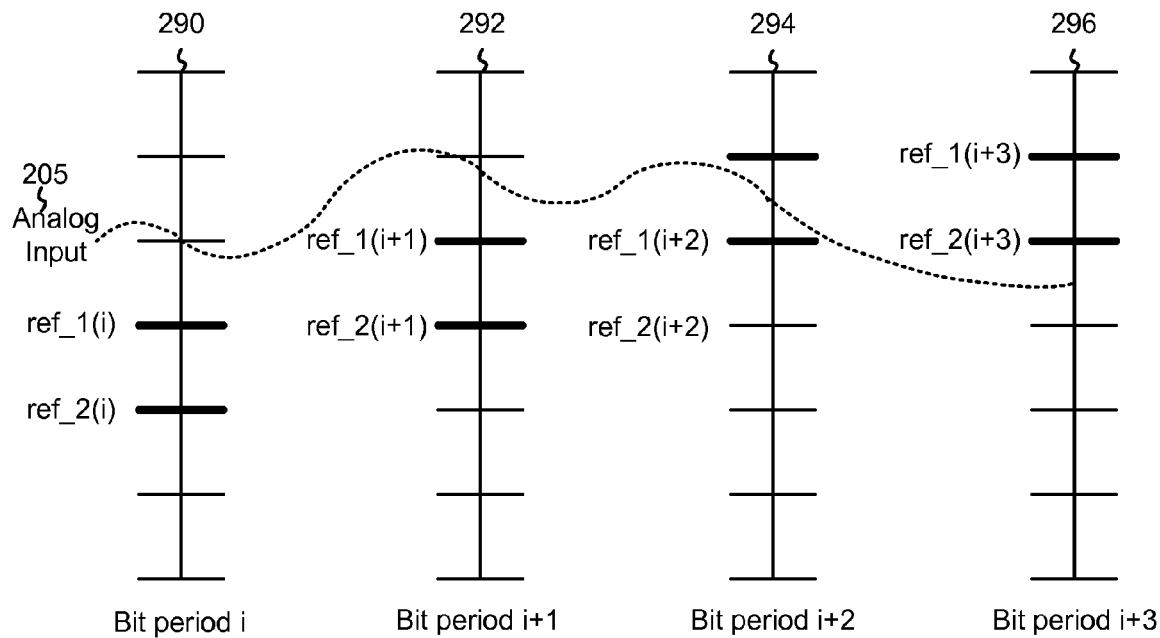
FIG. 2b depicts an exemplary series of comparisons performed using the dynamic analog to digital converter of FIG. 2.

Turning to FIG. 2b, an exemplary series of four consecutive samples 290, 292, 294, 296 are depicted to show the process of adjusting reference voltages (i.e., ref_1 and ref_2) by controller 205 to match analog input 205 (depicted as a dashed line). In the first sample 290, analog input 205 is higher than both ref_1 and ref_2 during a bit period i. In this case, the combination of output 213 and output 214 is '00' indicating to controller 295 that ref_1 and ref_2 are to be increased for the next sample. In the next sample 292, analog input analog input 205 is higher than both ref_1 and ref_2 during a bit period i+1. Again, the combination of output 213 and output 214 is '00' indicating to controller 295 that ref_1 and ref_2 are to be increased for the next sample. In the third sample 294, analog input analog input 205 falls between ref_1 and ref_2 during a bit period i+2. In this case, the combination of output 213 and output 214 is '01' indicating to controller 295 that ref_1 and ref_2 are to be maintained for the next sample. In the fourth sample 296, analog input 205 is lower than both ref_1 and ref_2 during a bit period i+3. In this case, the combination of output 213 and output 214 is '11' indicating to controller 295 that ref_1 and ref_2 are to be decreased for the next sample. It should be noted that while FIG. 2b depicts the spacing between ref_1 and ref_2 to be constant, that this is not necessarily required.

Figure 3A:
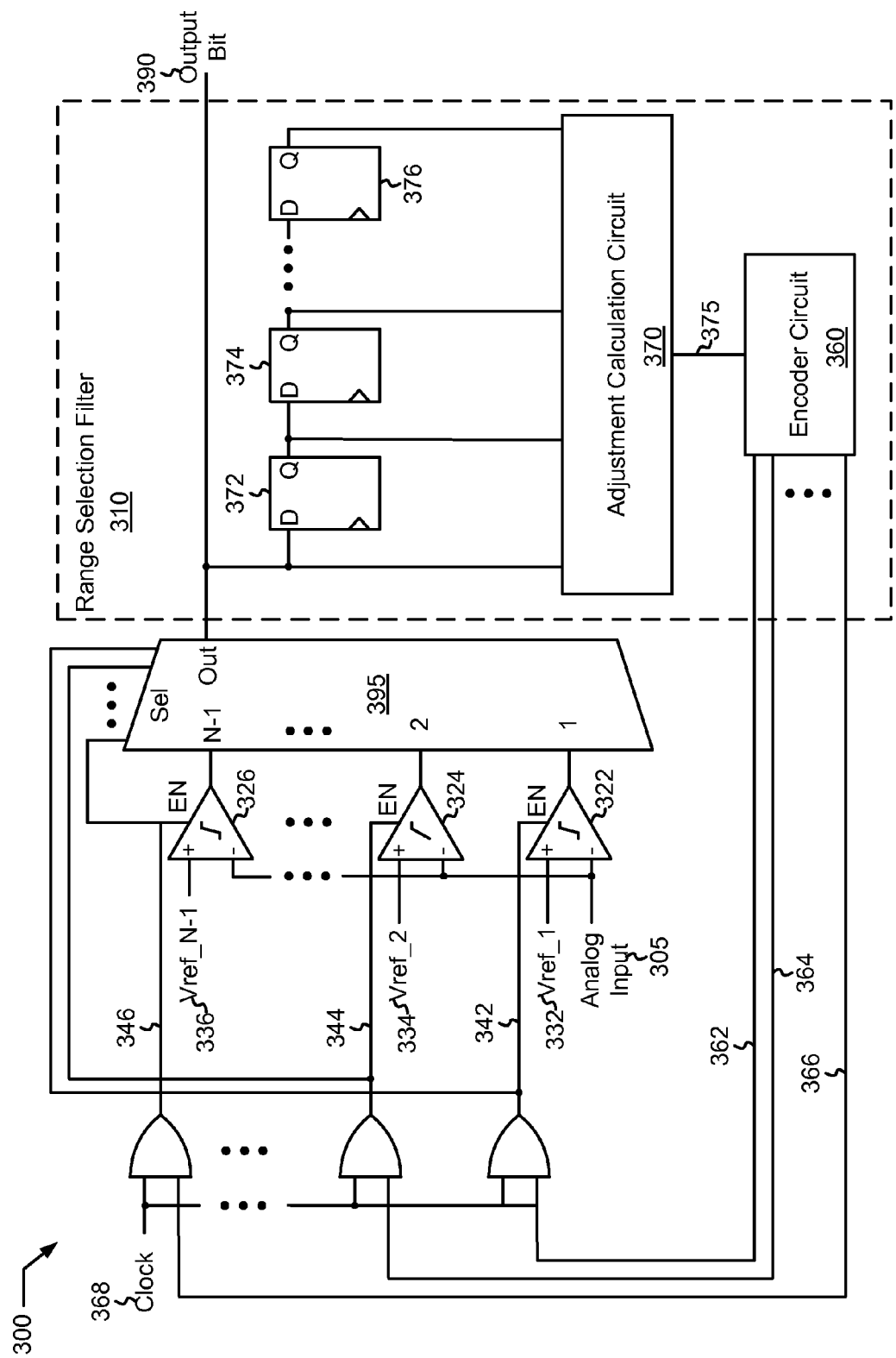
FIG. 3a depicts a dynamic analog to digital converter including range selection filtering that may be used in relation to various embodiments of the present invention.

As more fully described in U.S. patent application Ser. No. 12/134,488 entitled "Systems and Methods for Analog to Digital Conversion" and filed by Chmelar on a date even herewith, a dynamic range analog to digital converter may be unified with a Decision Feedback Equalization (DFE) circuit to yield a relatively high bandwidth analog to digital converter. The entirety of the aforementioned reference is incorporated herein by reference for all purposes. Turning to FIG. 3a, a dynamic analog to digital converter 300 including a range selection filter 310 (shown in dashed lines) is depicted that may be modified for use in relation to various embodiments of the present invention. Dynamic analog to digital converter 300 includes a number of comparators 322, 324, 326 that each receives a respective voltage reference 332, 334, 336 distributed across an input range of dynamic analog to digital comparator 300. When enabled, comparators 322, 324, 326 each compare their respective voltage reference with an analog input 305. A particular subset of comparators 332, 334, 336 is enabled during a given bit period by respective ones of bit enables 342, 344, 346. Bit enables 342, 344, 346 are asserted for a clock period by logically ANDing enable signals 362, 364, 366 provided from an encoder circuit 360 with a clock signal 368. By selectively asserting bit enables 342, 344, 346, a particular input range for dynamic analog to digital converter 300 may be selected. The non-selected comparators remain in an idle state allowing for the conservation of power. As dynamic analog to digital converter 300 operates by selecting different subsets of comparators to shift the active input range, it is a virtual level shifting analog to digital converter. In addition, bit enables 342, 344, 346 are provided to a 342, 344, 346 are provided to a multiplexer 395 that provides an output bit 390 to be driven by the selected comparator. It should be noted that while FIG. 3a depicts three comparators and associated circuits and signals, that any number of comparators and associated circuits and signals are possible in accordance with different embodiments of the present invention.

Range selection filter 310 includes a shift register formed of a number of flip-flops 372, 374, 376. In particular, flip-flop 372 receives output bit 390 synchronized to a clock signal (not shown) and flip-flop 374 receives the output of flip-flop 372 synchronized to the same clock signal. The output of flip-flop 374 is provided to a succeeding flip-flop, and flip-flop 376 receives the output of a preceding flip-flop synchronized to the same clock signal. The outputs of flip-flops 372, 374, 376 are provided to an adjustment calculation circuit 370 that calculates an adjustment to the input range for dynamic analog to digital converter 300 based at least in part on a portion of a previously received data pattern. An adjustment output 375 of adjustment calculation circuit 370 is provided to encoder circuit 360 that encodes adjustment output 375 to produce enable signals 362, 364, 366. As previously discussed, enable signals 362, 364, 366 are ultimately operable to select a particular subset of comparators 322, 324, 326 and thus to dynamically select the input range of dynamic analog to digital converter 300. As enable signals 362, 364, 366 are at least partially controlled by a portion of a received data set, dynamic analog to digital converter 300 is capable of using a received data stream to predict a desired input range of a subsequent bit period. Range selection filter 310 may be designed such that the period from selecting an input range and providing output bit 390 for one bit period through selecting a subsequent input range can be completed within a single period of clock signal 368. Based on the disclosure provided herein, one of ordinary skill in the art will recognize a variety of adjustment calculation circuits that may be used in accordance with different embodiments of the present invention to utilize data dependencies in selecting an appropriate input range for a succeeding bit period.

Figure 4:
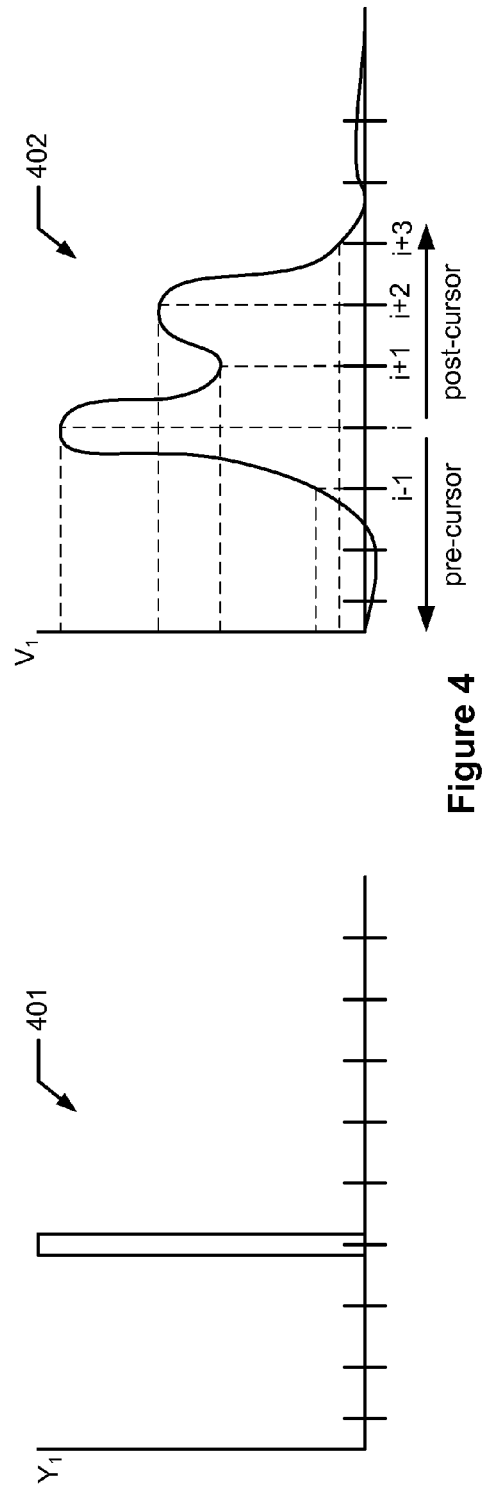
FIG. 4 depicts an exemplary pulse applied to a channel, and a channel response to that pulse.

Range selection filter 310 may be a Decision Feedback Equalization (DFE) circuit that is used to adjust for data dependent noise that would otherwise degrade the performance of dynamic analog to digital converter 300. A DFE circuit is a Finite Impulse Response (FIR) filter with taps that correspond to the value of the impulse response of a channel during defined bit periods. Turning to FIG. 4, an exemplary pulse 401 applied to a channel, and a channel response 402 thereto are depicted. C(i) indicates the magnitude of the impulse response (i.e., cursor); C(i−1) indicates the pre-cursor inter-symbol interference at a bit period i−1; and C(i+1), C(i+2) and C(i+3) indicate post-cursor inter-symbol interference at bit periods i+1, i+2 and i+3, respectively. From this, it is understood that an analog input signal representing a bit value during bit period i will interfere with the analog input signal during the previous bit period i−1, and during subsequent bit periods i+1, i+2 and i+3. Accordingly, the analog input signal during bit periods i−1, i+1, i+2 and i+3 bit periods will interfere with the analog input signal during bit period i. Thus, to compensate for inter-symbol interference, inter-symbol interference values corresponding to the aforementioned bit periods can be summed and subtracted from the analog input signal during bit period i. The sum of the relevant inter-symbol interference values is referred to herein as an adjustment factor. In general, the adjustment factor can be found by multiplying the sampled bit value (logic '0' or logic '1') determined during relevant bit periods with the respective coefficient found from the impulse response. The adjusted analog input signal is then be sampled using a comparator. This process may be used to determine the correct logic value of a sample of an analog input signal in the presence of inter-symbol interference.

Figure 5:
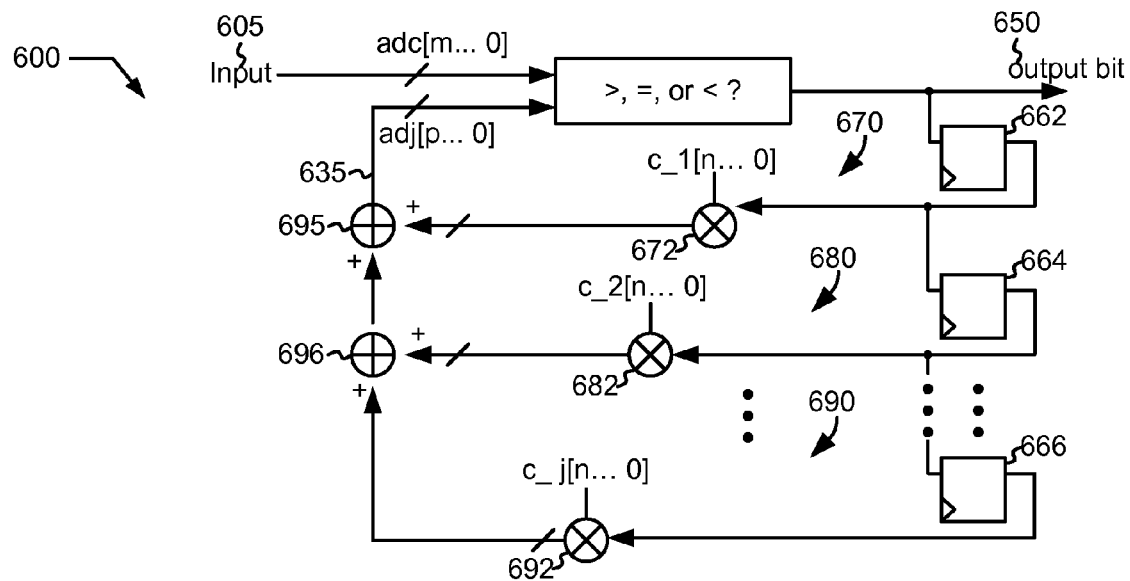
FIG. 5 depicts an exemplary digital DFE that may be modified for use in relation to some embodiments of the present invention.

In some cases, range selection filter 310 is designed to mitigate post-cursor inter-symbol interference as described in FIG. 4. FIG. 5 depicts an exemplary digital DFE circuit 600 that is capable of mitigating the aforementioned interference. Digital DFE circuit 600 is used to describe the interaction of flip-flops 372, 374, 376 and adjustment calculation circuit 370 of FIG. 3a. In particular, digital DFE circuit 600 may be modified to perform the function of flip-flops 372, 374, 376 and adjustment calculation circuit 370, and thus to perform the function of range selection filter 310 along with encoder circuit 360. As more fully explained below, the comparison function of digital DFE circuit 600 may be eliminated, and the mathematical functions may be implemented using pre-computation methods and lookup tables as are known in the art. Such modifications allow digital DFE circuit 600 to operate at speeds comparable to its analog counterpart, but without the demands for power and area exhibited by the analog counterpart.

As shown, digital DFE circuit 600 receives a digital input 605 (i.e., adc[m . . . 0]) at a digital comparison circuit 640 that is operable to compare digital input 605 with an adjustment factor 635 (i.e., adj[p . . . 0]), and provides an output bit 650. Digital comparison block 640 is often a limiting factor in using a digital DFE as it can require multiple layers of logic to perform its comparison. As more fully described below, by incorporating digital DFE 600 into dynamic analog to digital converter 300, digital comparison circuit 640 can be eliminated. This facilitates the completion of a range shift within one cycle of clock signal 368. Output bit 650 is fed to a shift register including a number (j) of flip-flops 662, 664, 666. The outputs of flip-flops 662, 664, 666 are used in respective feedback paths 670, 680, 690 where the respective output is multiplied by an inter-symbol interference value associated with the particular bit time. In particular, a feedback path 670 includes a digital multiplier 672 that multiplies the output of flip-flop 662 by an n-bit digital representation of the inter-symbol interference value corresponding to bit time i+1 (i.e., c1(n . . . 0)); feedback path 680 includes a digital multiplier 682 that multiplies the output of flip-flop 664 by an n-bit representation of the inter-symbol interference value corresponding to bit time i+2 (i.e., c2(n . . . 0)); and feedback path 690 includes a digital multiplier 692 that multiplies the output of flip-flop 666 by an n-bit representation of the inter-symbol interference value corresponding to bit time i+j (i.e., cj(n . . . 0)). The resulting products from digital multipliers 672, 682, 692 are summed using digital adder circuits 695, 696 to create adjustment factor 635. It should be noted that a number (k) of pre-cursor inter-symbol interferences can be mitigated in similar fashion by delaying the sampled analog input by k bit periods and including k corresponding feed forward paths to the exiting j feedback paths. Such an analog DFE circuit has and advantage of space and power consumption over a corresponding analog DFE circuit.

Further, the traditional timing limits of digital DFE circuit 600 can be reduced through integration into dynamic analog to digital converter 300. In particular, digital comparison block 640 determines whether the output of dynamic analog to digital converter 300 is less than, greater than, or equal to an adjustment factor. The following pseudocode demonstrates the function of the digital comparison block 640:

If ((adc[m . . . 0]−adj[p . . . 0])<=0)
{
Output Bit=0
}
Else If ((adc[m . . . 0]−adj[p . . . 0])>0)
{
Output Bit=1
}

Of note, the forgoing comparison is identical to performing a direct comparison of adc[m . . . 0] with adj[p . . . 0]. Thus, adjustment factor 635 can be used directly to select which subset of comparators 322, 324, 326 are to be activated during a subsequent bit period. This circumvents the need for digital comparison circuit 640 and reduces adjustment calculation circuit 370 to a set of digital multiplier circuits (corresponding to multipliers 672, 682, 692) that multiply the outputs of flip-flops 372, 374, 376 by their respective inter-symbol interference values (corresponding to c1, c2, cj), and a set of digital adder circuits (corresponding to digital adder circuits 695, 696). The output of the aforementioned digital adder circuits can be used as adjustment factor 375. It should be noted that in some cases, the aforementioned digital multiplier circuits and digital adder circuits may be eliminated through the use of well known methods of pre-computing the products and summation via a look-up table. This further enhances the speed of range selection filter 310. Encoder circuit 360 may be a 1-hot encoder that asserts only one of enables 362, 364, 366 during any bit period, and thereby selects only a single comparator of comparators 322, 324, 326 for use during the subsequent bit period as controlled by ANDing enables 362, 364, 366 with clock signal 368.

Figure 3B:
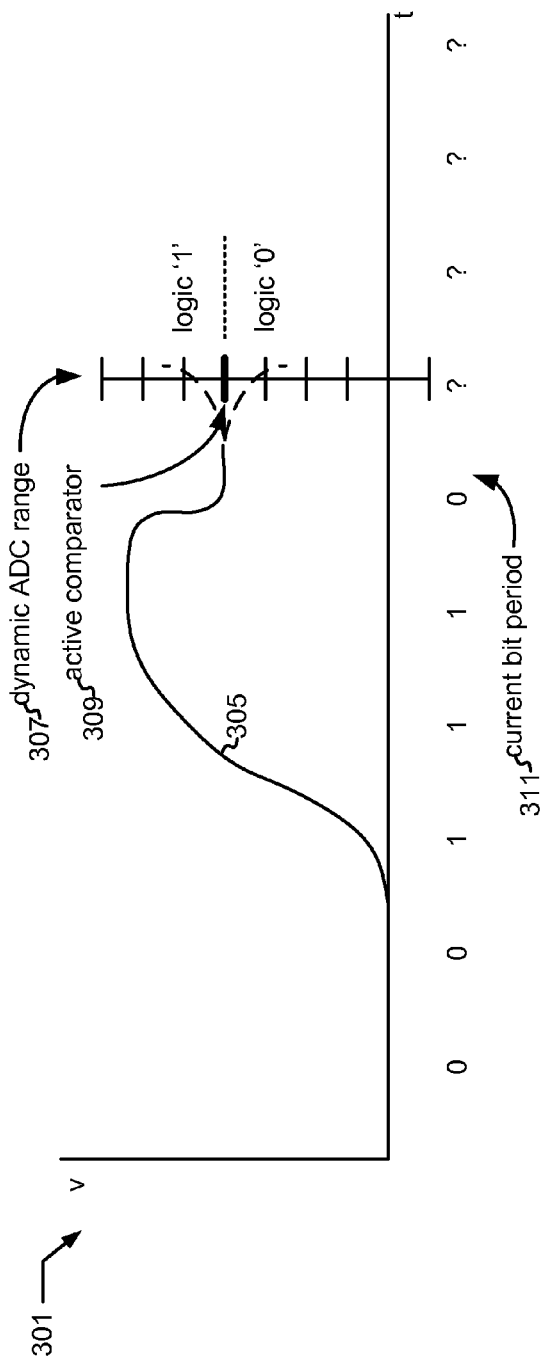

Turning to FIG. 3b, a timing diagram 301 depicts an exemplary operation of dynamic analog to digital converter 300. Following timing diagram 301, analog input 305 varies over time though a number of preceding bit periods. A dynamic ADC range 307 represents the range over which dynamic analog to digital converter 300 operates with each of the hash marks representing a comparator that may be selected for comparison with analog input 305. Each of the preceding bit periods produces a single bit that is provided as output bit 390. One or more of the values from the preceding bit periods are stored in flip-flops 372, 374, 376, and are used by adjustment calculation circuit 370 to select the comparator (i.e., active comparator 309) for use in a current bit period 311. During current bit period 311, analog input 305 is compared using the selected comparator and associated voltage reference. Where analog output 305 exceeds the voltage reference associated with the selected comparator, output bit 390 is a logic '1'. Conversely, where analog output 305 is less than or equal to the voltage reference, output bit 390 is a logic '0'.

Figure 6:
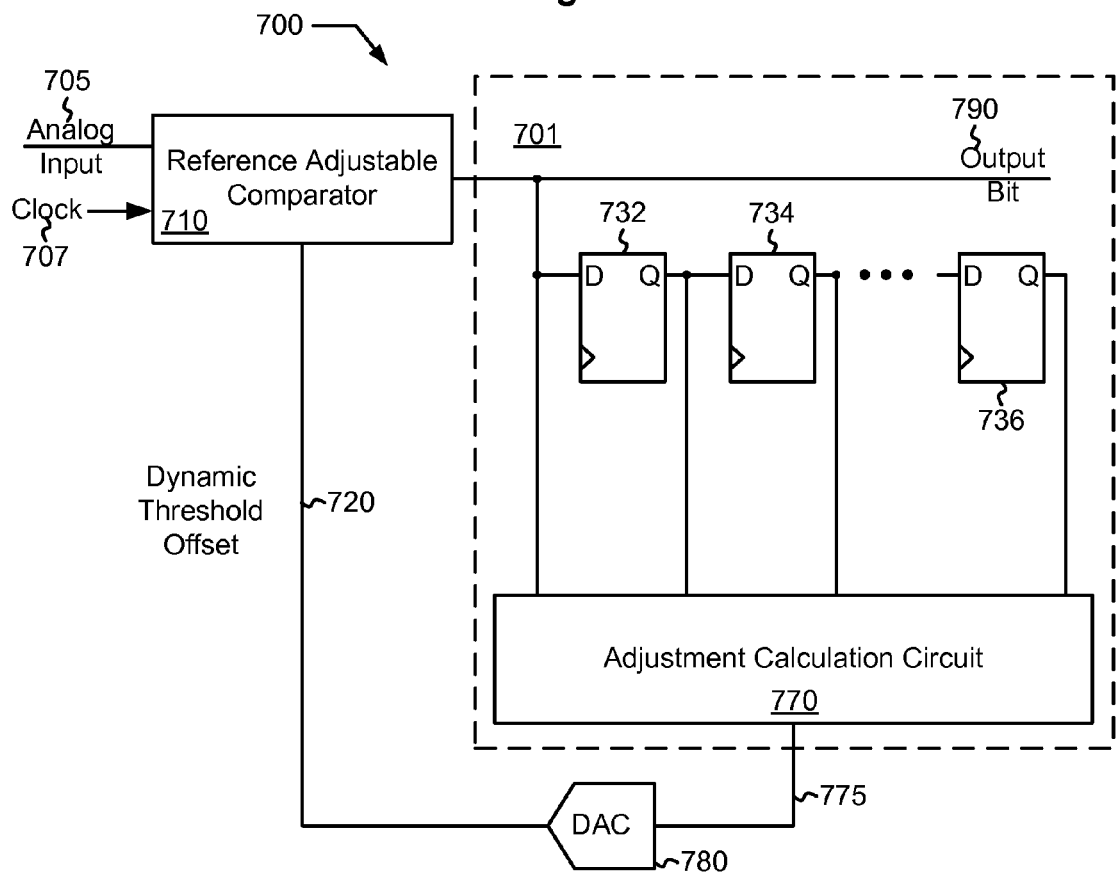
FIG. 6 depicts another dynamic analog to digital converter including range selection filtering that may be used in relation to other embodiments of the present invention.

Turning to FIG. 6, another dynamic analog to digital converter 700 is including range selection filtering is depicted. In contrast to dynamic analog to digital converter 300, dynamic analog to digital converter 700 uses physical reference level shifting to select a range around which an analog input 705 is compared. Dynamic analog to digital converter 700 receives analog signal 705 at a reference adjustable comparator 710. Reference adjustable comparator 710 may include a single comparator receiving both analog input 705 and a voltage reference offset by a dynamic threshold offset 720. When a clock signal 707 is asserted, the comparator provides an output bit 790 that reflects the comparison of analog input 705 with the offset reference voltage according to the following pseudocode:

If (analog input>(reference voltage+dynamic threshold offset))
{
Output Bit=1
}
Else If (analog input<=(reference voltage+dynamic threshold offset))
{
Output Bit=0
}

Output bit 790 is provided to a range selection filter 701 (shown in dashed lines) that uses various instances of output bit 790 to predict a desirable physical reference level shift for the succeeding bit period. In particular, range selection filter 701 includes a shift register formed of a number of flip-flops 732, 734, 736. In particular, flip-flop 732 receives output bit 790 synchronized to a clock signal (not shown) and flip-flop 734 receives the output of flip-flop 732 synchronized to the same clock signal. The output of flip-flop 734 is provided to a succeeding flip-flop, and flip-flop 736 receives the output of a preceding flip-flop synchronized to the same clock signal. The outputs of flip-flops 732, 734, 736 are provided to an adjustment calculation circuit 770 that calculates an adjustment to the input range for dynamic analog to digital converter 700 based at least in part on a portion of a previously received data pattern. An adjustment output 775 is provided to a digital to analog converter 780. Digital to analog converter 780 generates dynamic threshold offset 720 based on adjustment output 775.

As with dynamic analog to digital converter 300, dynamic analog to digital converter 700 may use a DFE like approach to implement range selection filter 701. For example, a digital DFE without a comparison block and having pre-computation and lookup table capability may be used. It should be noted that in alternative embodiments, reference adjustable comparator 710 may include more than one comparator each comparing analog input 705 with distinct voltage references offset by dynamic threshold offset 720. In such a case, output bit 790 would include a plurality of output bits that may be used in similar fashion to predict a reference level for a succeeding bit period.

Figure 7:
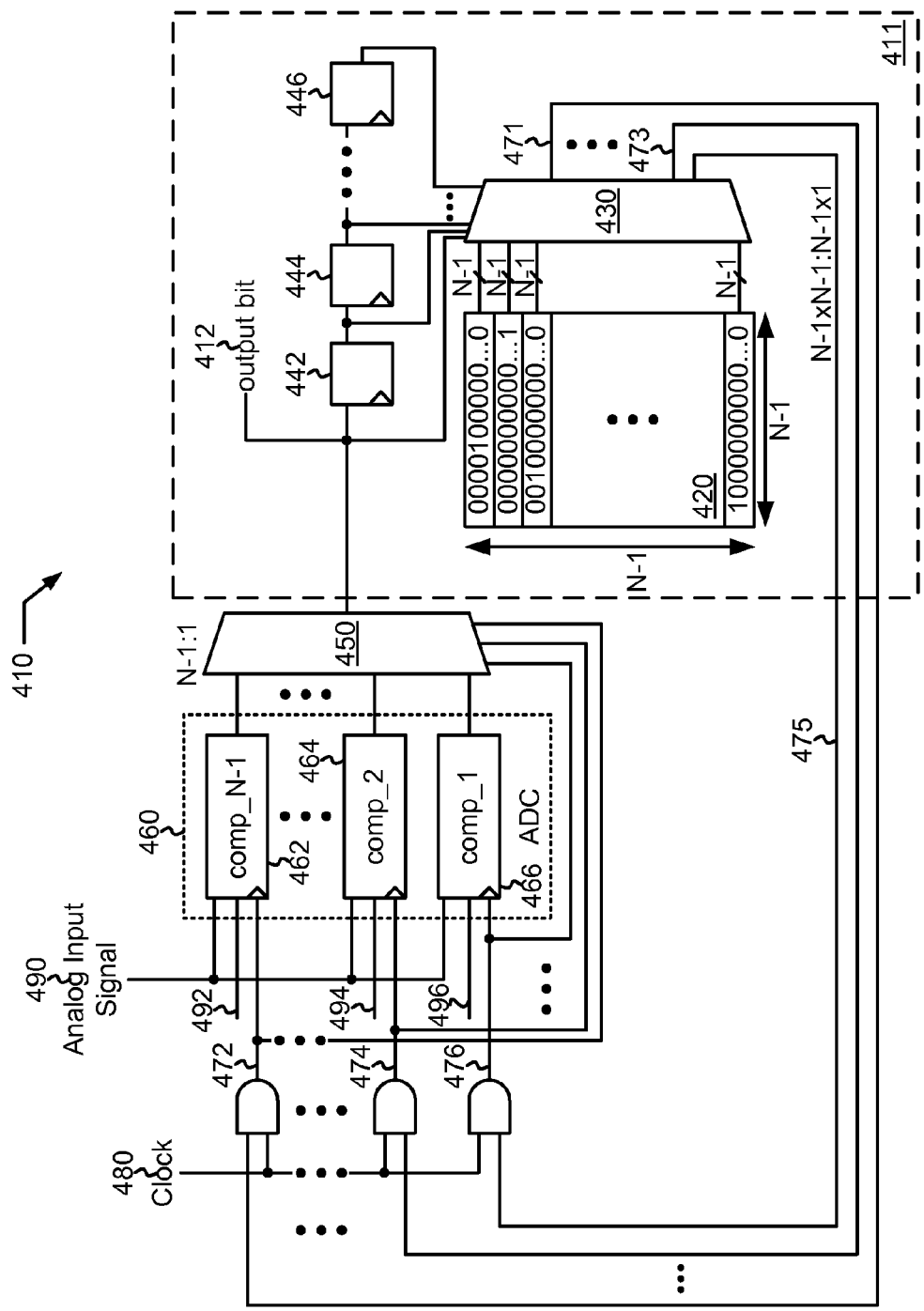
FIG. 7 depicts a dynamic analog to digital converter including a lookup table based digital DFE in accordance with various embodiments of the present invention.

Turning to FIG. 7, a dynamic analog to digital converter 410 including a lookup table based digital DFE 411 (shown in dashed lines) is depicted in accordance with various embodiments of the present invention. Dynamic analog to digital converter 410 includes a number of comparators 462, 464, 466 that each receives a respective voltage reference 492, 494, 496 distributed across an input range of dynamic analog to digital comparator 410. When enabled, comparators 462, 464, 466 each compare their respective voltage reference with an analog input 490. A particular subset of comparators 462, 464, 466 is enabled during a given bit period by respective ones of bit enables 472, 474, 476. Bit enables 472, 474, 476 are asserted for a clock period by logically ANDing enable signals 471, 473, 475 provided from an multiplexer 430 with a clock signal 480. Multiplexer 430 selects between a number of pre-programmed comparator selections maintained in a lookup table 420 that are in part based on the previous bit history (and in some cases, the succeeding bit history). By selectively asserting bit enables 472, 474, 476, a particular input range for dynamic analog to digital converter 410 may be selected. The non-selected comparators remain in an idle state allowing for the conservation of power. As dynamic analog to digital converter 410 operates by selecting different subsets of comparators to shift the active input range, it is a virtual level shifting analog to digital converter. In addition, bit enables 472, 474, 476 are provided to a multiplexer 450 that provides an output bit 412 to be driven by the selected comparator. It should be noted that while FIG. 7 depicts three comparators and associated circuits and signals, that any number of comparators and associated circuits and signals are possible in accordance with different embodiments of the present invention.

Lookup table based digital DFE 411 includes a shift register formed of a number of flip-flops 442, 444, 446. In particular, flip-flop 442 receives output bit 412 synchronized to a clock signal (not shown) and flip-flop 444 receives the output of flip-flop 442 synchronized to the same clock signal. The output of flip-flop 444 is provided to a succeeding flip-flop, and flip-flop 446 receives the output of a preceding flip-flop synchronized to the same clock signal. The outputs of flip-flops 442, 444, 446 are provided as selector inputs to multiplexer 430. Based on the values of the outputs of output bit 412 and flip-flops 442, 444, 446, a pre-programmed comparator selection value from lookup table 420 is provided as an output from multiplexer 430. The pre-programmed comparator selections are programmed to cancel inter symbol interference based on the selector values provided to multiplexer 430. From a timing standpoint, the critical path from one edge of clock signal 480 until output bit 412 is stable and to when enable signals 471, 473, 475 are available for ANDing with clock signal 480 may be reduced when compared with circuits using combinational logic to calculate the appropriate enable signals based on output bit 412 and flip-flops 442, 444, 446.

Figure 8:
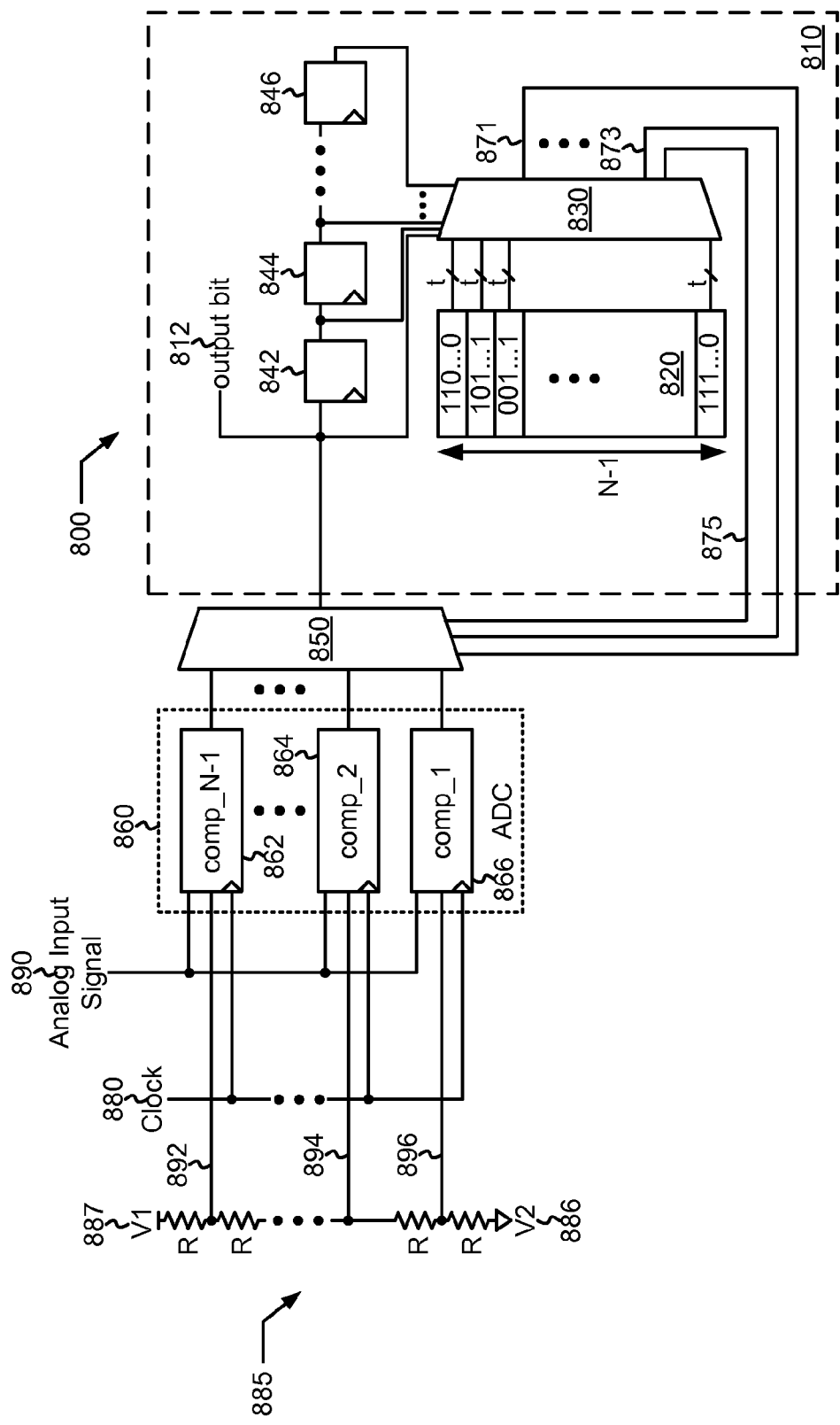
FIG. 8 depicts a static analog to digital converter including a lookup table based digital DFE in accordance with various embodiments of the present invention.

Turning to FIG. 8, a static analog to digital converter 800 including a lookup table based digital DFE 810 (shown in dashed lines) is depicted in accordance with various embodiments of the present invention. Static analog to digital converter 800 includes a number of comparators 862, 864, 866 that each receives a respective voltage reference 892, 894, 896 distributed across an input range of dynamic analog to digital comparator 800. Voltage references 892, 894, 896 are generated by a resistor chain 885 extending between a lower voltage 886 and n upper voltage 887. Comparators 862, 864, 866 each compare their respective voltage reference with an analog input 890 whenever clocked by clock signal 880. In contrast to previous analog to digital converters discussed herein, all of comparators 862, 864, 866 are enabled during each bit period. However, the output of only one of comparators 862, 864, 866 is selected as an output bit 812 based on bit enables 872, 874, 876 provided by lookup table based digital DFE 810. It should be noted that while FIG. 8 depicts three comparators and associated circuits and signals, that any number of comparators and associated circuits and signals are possible in accordance with different embodiments of the present invention.

Lookup table based digital DFE 810 includes a shift register formed of a number of flip-flops 842, 844, 846. In particular, flip-flop 842 receives output bit 812 synchronized to a clock signal (not shown) and flip-flop 844 receives the output of flip-flop 842 synchronized to the same clock signal. The output of flip-flop 844 is provided to a succeeding flip-flop, and flip-flop 846 receives the output of a preceding flip-flop synchronized to the same clock signal. The outputs of flip-flops 842, 844, 846 are provided as selector inputs to multiplexer 830. Based on the values of the outputs of output bit 812 and flip-flops 842, 844, 846, a pre-programmed comparator selection value from a lookup table 820 is provided as an output from multiplexer 830. The pre-programmed comparator selection values are programmed to cancel inter symbol interference based on the selector values provided to multiplexer 830. From a timing standpoint, the critical path from one edge of clock signal 880 until output bit 812 is stable and to when enable signals 871, 873, 875 are available for selecting between comparators 862, 864, 866 during the subsequent bit period is reduced when compared with the corresponding critical path in dynamic analog to digital converter 410 discussed above in relation to FIG. 7. However, this comes at the cost of increased power dissipation as all of comparators 862, 864, 866 are clocked for each bit period.

Figure 9:
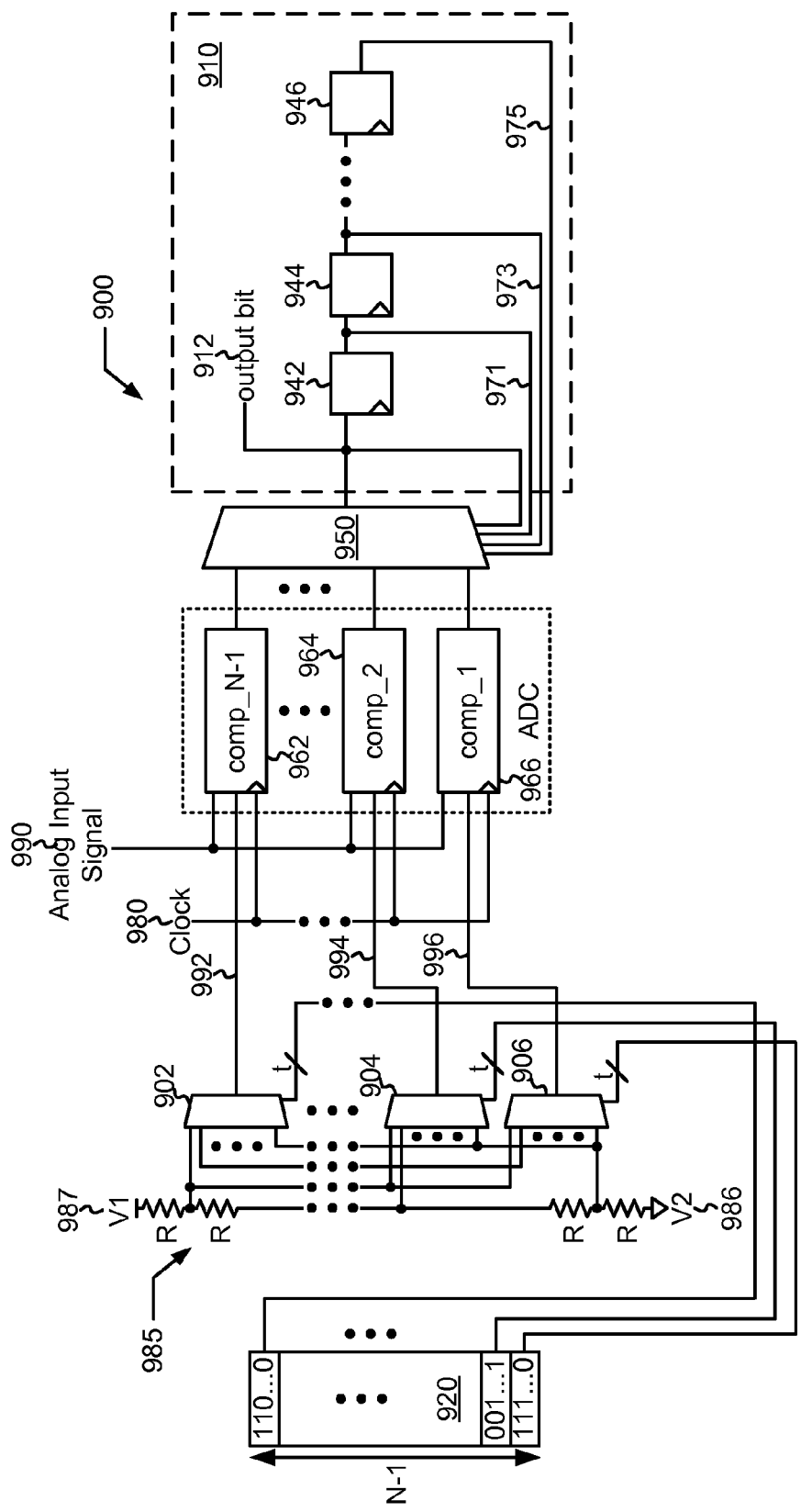
FIG. 9 depicts a static analog to digital converter including a lookup table based digital DFE that is similar to that disclosed in relation to FIG. 8, except that the dynamic addressing of the lookup table is replaced by programmable addressing in order to further reduce latency in the critical path in accordance with various other embodiments of the present invention.

Turning to FIG. 9, a static analog to digital converter 900 including a digital DFE 910 (shown in dashed lines) is depicted in accordance with various other embodiments of the present invention. Static analog to digital converter 900 is similar to that disclosed in relation to FIG. 8, except that the dynamic addressing of the lookup table is replaced by programmable addressing in order to further reduce latency in the critical path. Static analog to digital converter 900 includes a number of comparators 962, 964, 966 that each receives a respective voltage reference 992, 994, 996 distributed across an input range of dynamic analog to digital comparator 900. Voltage references 992, 994, 996 are generated by a resistor chain 985 extending between a lower voltage 986 and n upper voltage 987. The input range of static analog to digital converter 900 may be modified by programmably addressing a different input range selection from a lookup table 920. The output from lookup table 920 drives the selector inputs of multiplexers 902, 904, 906. Comparators 962, 964, 966 each compare their respective voltage reference with an analog input 990 whenever clocked by clock signal 980. Of note, comparators 962, 964, 966 are each clocked on each bit period. However, the output of only one of comparators 962, 964, 966 is selected as an output bit 912 based on output bit 912 and bit enables 971, 973, 977 provided by digital DFE 910. It should be noted that while FIG. 9 depicts three comparators and associated circuits and signals, that any number of comparators and associated circuits and signals are possible in accordance with different embodiments of the present invention.

Digital DFE 910 includes a shift register formed of a number of flip-flops 942, 944, 946. In particular, flip-flop 942 receives output bit 912 synchronized to a clock signal (not shown) and flip-flop 944 receives the output of flip-flop 942 synchronized to the same clock signal. The output of flip-flop 944 is provided to a succeeding flip-flop, and flip-flop 946 receives the output of a preceding flip-flop synchronized to the same clock signal. The outputs of flip-flops 942, 944, 946 are provided as selector inputs to multiplexer 930. As mentioned above, the output bit 912 and the outputs of flip-flops 942, 944, 946 are provided as selector inputs to a multiplexer 950 that selects which of comparators 962, 964, 966 that will provide output bit 912. Multiplexer 950 may be an N−1 to 1 multiplexer that can be implemented as a [$\log_2(N)$] levels of 2 to 1 multiplexers. In such a case, the total number of multiplexers is described by the following equation:

$$\text{number of multiplexers} = \Sigma_{i=1}^{log2N} 2^{i-1}.$$

From a timing standpoint, the critical path from one edge of clock signal 980 until output bit 912 and bit enables 971, 973, 975 are available for selecting between comparators 962, 964, 966 during the subsequent bit period is reduced when compared with the corresponding critical path in static analog to digital converter 800 discussed above in relation to FIG. 8.

Figure 10A:
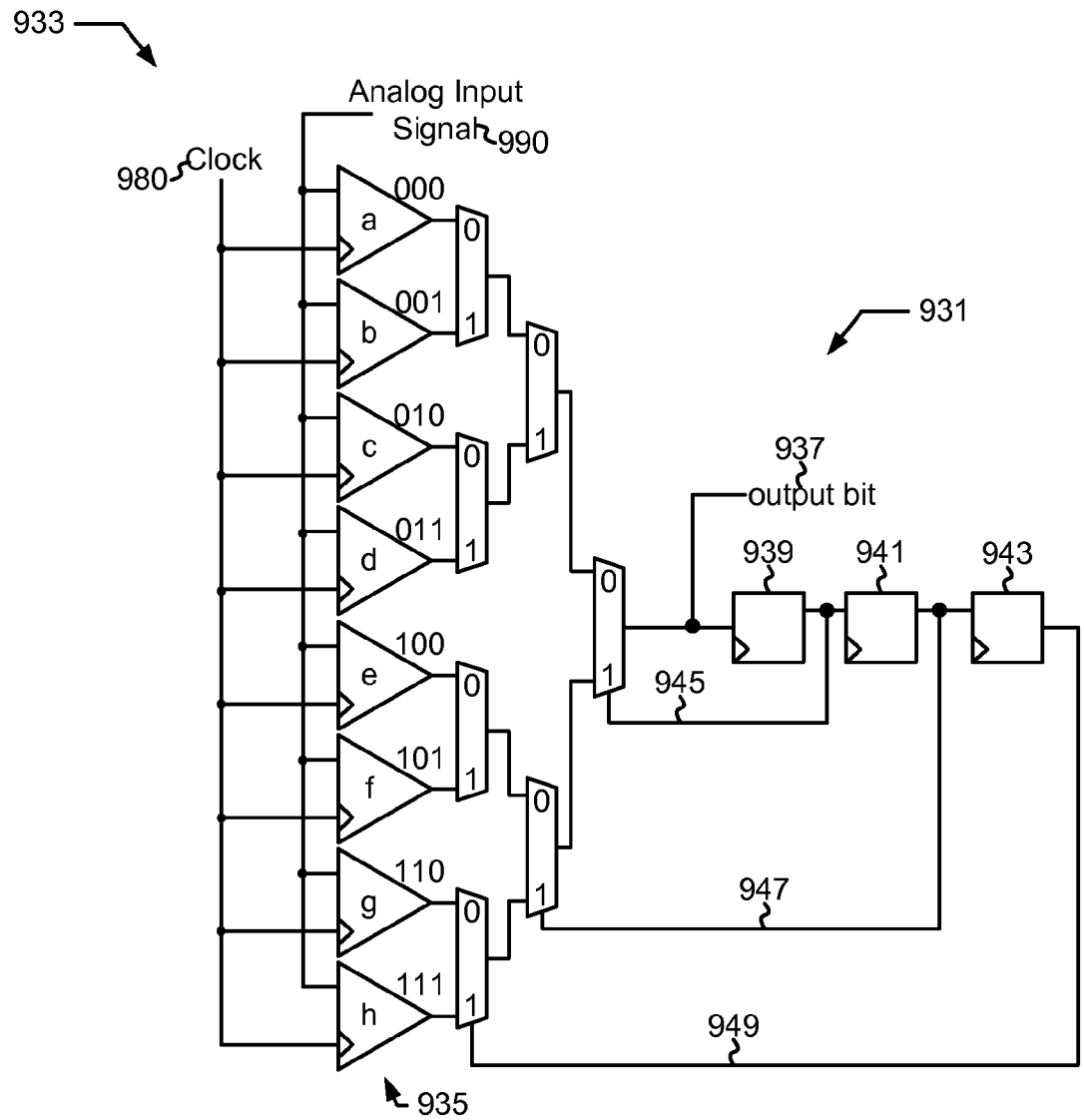
FIG. 10a is an analog to digital converter using a multiplexer tree implemented in combinatorial logic in accordance with some embodiments of the present invention.

Turning to FIG. 10a, an analog to digital converter 933 using a multiplexer tree 931 implemented in combinatorial logic in accordance with some embodiments of the present invention. Analog to digital converter 933 includes a number of comparators 935 that each compare analog input 990 against respective reference voltages (not shown) that span the input range of analog to digital comparator 933. An output bit 937 of one of comparators 935 is selected using multiplexer tree 931. Output bit 937 is selected based on prior determined outputs such that inter symbol interference is reduced. In particular, output bit 937 is provided to a shift register that is made up by three flip-flops 939, 941, 943. Enable bits 945, 947, 949 which are outputs from flip-flops 939, 941, 943 are used as selector inputs for the different tiers of multiplexer tree 931. Thus, the critical path extends from one edge of clock signal 980 until the selected comparator output propagates through three tiers of multiplexers until output bit 937 becomes stable before having to be clocked into flip-flop 939.

Figure 10B:
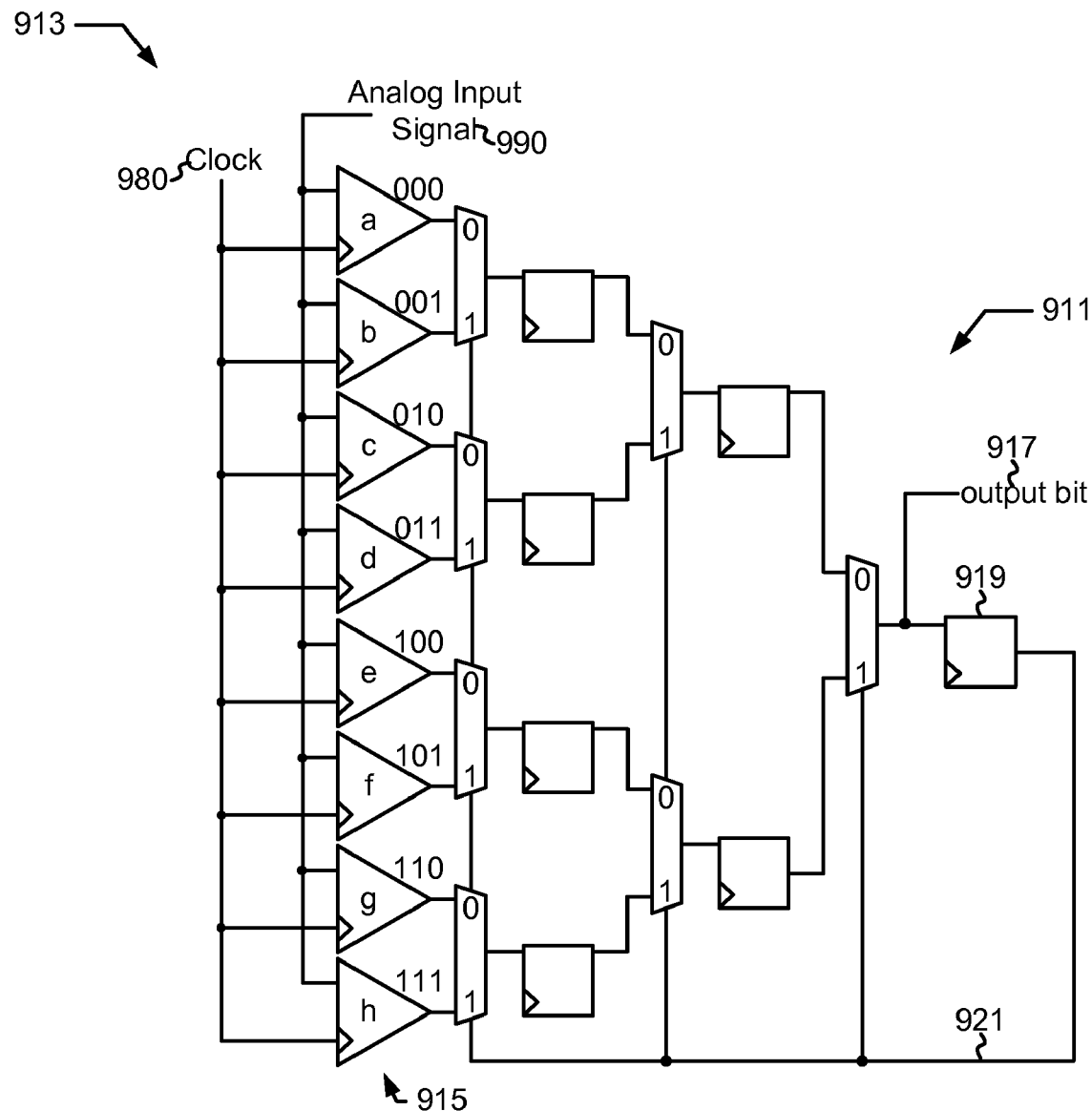
FIG. 10b is another analog to digital converter using a multiplexer tree implemented in synchronized combinatorial logic in accordance with one or more embodiments of the present invention.

FIG. 10b is another analog to digital converter 913 using a multiplexer tree 915 implemented in synchronized combinatorial logic in accordance with one or more embodiments of the present invention. Analog to digital converter 913 includes a number of comparators 915 that each compare analog input 990 against respective reference voltages (not shown) that span the input range of analog to digital comparator 913. An output bit 917 of one of comparators 915 is selected using multiplexer tree 911. Output bit 917 is selected based on prior determined outputs such that inter symbol interference is reduced. In particular, output bit 917 is provided to a flip-flop 919. A single enable bit 921 provided from flip-flop 919 is used as a selector input for the different tiers of multiplexer tree 911. The outputs of each tier of multiplexer tree 911 are synchronized to clock signal 980 using flip-flops. In this way, enable bit 921 from flip-flop 919 receives three successive values of output bit 917 (i.e., the value of output bit 917 from three successive bit periods). In this way, the generation of the enable bits from analog to digital converter 933 (i.e., the output of flip-flops 939, 941, 943) is pipelined. By doing so, an equivalent result to that discussed above in relation to analog to digital converter 933 can be achieved, while reducing the latency through the critical path. In this case, the critical path extends from one edge of clock signal 980 until the selected comparator output propagates through a single multiplexer and is set up for registering in a flip-flop receiving the output of the comparator. Such a pipelined approach provides a similar throughput to the un-pipelined approach of FIG. 9b, while alleviating the critical timing path.

Figure 11A:
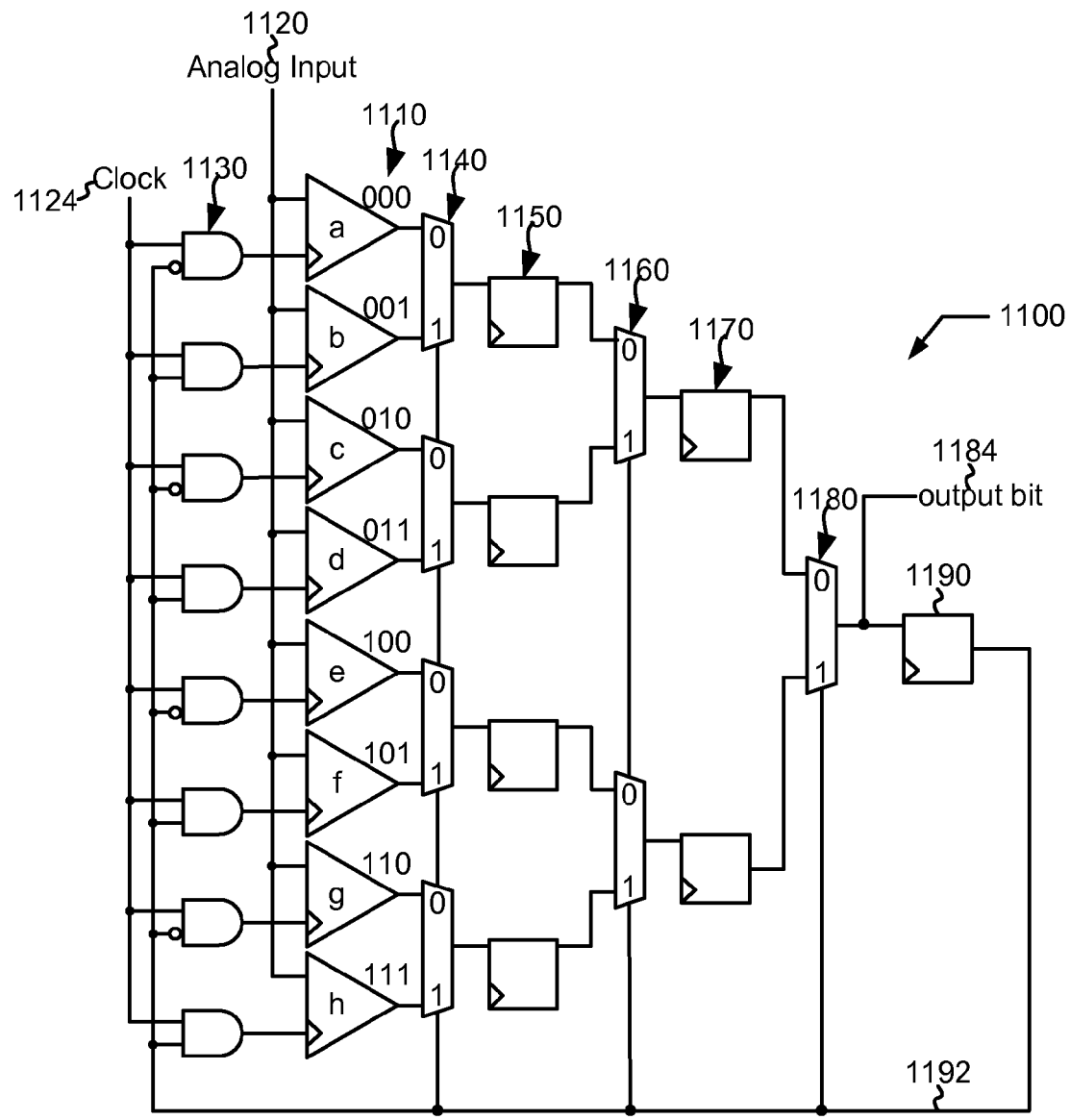
FIG. 11a depicts an analog to digital converter using a multiplexer tree implemented in synchronized combinatorial logic, and including power savings features in accordance with one or more embodiments of the present invention.

Turning to FIG. 11a, an analog to digital converter 1100 using a multiplexer tree implemented in synchronized combinatorial logic, and including power savings features is depicted in accordance with one or more embodiments of the present invention. Analog to digital converter 1100 includes a bank of eight comparators 1110 that each compare an analog input 1120 against respective reference voltages (not shown). In particular, a distinct reference voltage is provided to each of comparators 1110 with the reference voltages extending across the input range of analog to digital converter 1110. Each of comparators 1110 are clocked by a respective gated clock that is generated by a bank of AND gates 1130. In particular, one half of comparators 1110 (i.e., comparators b, d, f, h) are clocked whenever an output bit 1184 is asserted high and a clock input 1124 is asserted high. In contrast, the other half of comparators 1110 (i.e., comparators a, c, e, g) are clocked whenever output bit 1184 is asserted low and a clock input 1124 is asserted high. In this way, power is only being dissipated by one half of comparators 1110 during any given bit period.

Output bit 1184 is equivalent to the output of one of comparators 1110 asserted three bit periods prior based on previous bit assertions as selected by a synchronized multiplexer tree comprising a first tier of multiplexers 1140, a first tier of flip-flops 1150, a second tier of multiplexers 1160, a second level of flip-flops 1170, and a third tier multiplexer 1180. Output bit 1184 is stored in a flip-flop 1190. An enable output 1192 is provided to AND gates 1130 to enable clocking of a selected subset of comparators 1110. Further, enable output 1192 drives the selector input the multiplexers in first tier multiplexers 1140, second tier multiplexers 1160 and third tier multiplexer 1180.

Figure 11B:
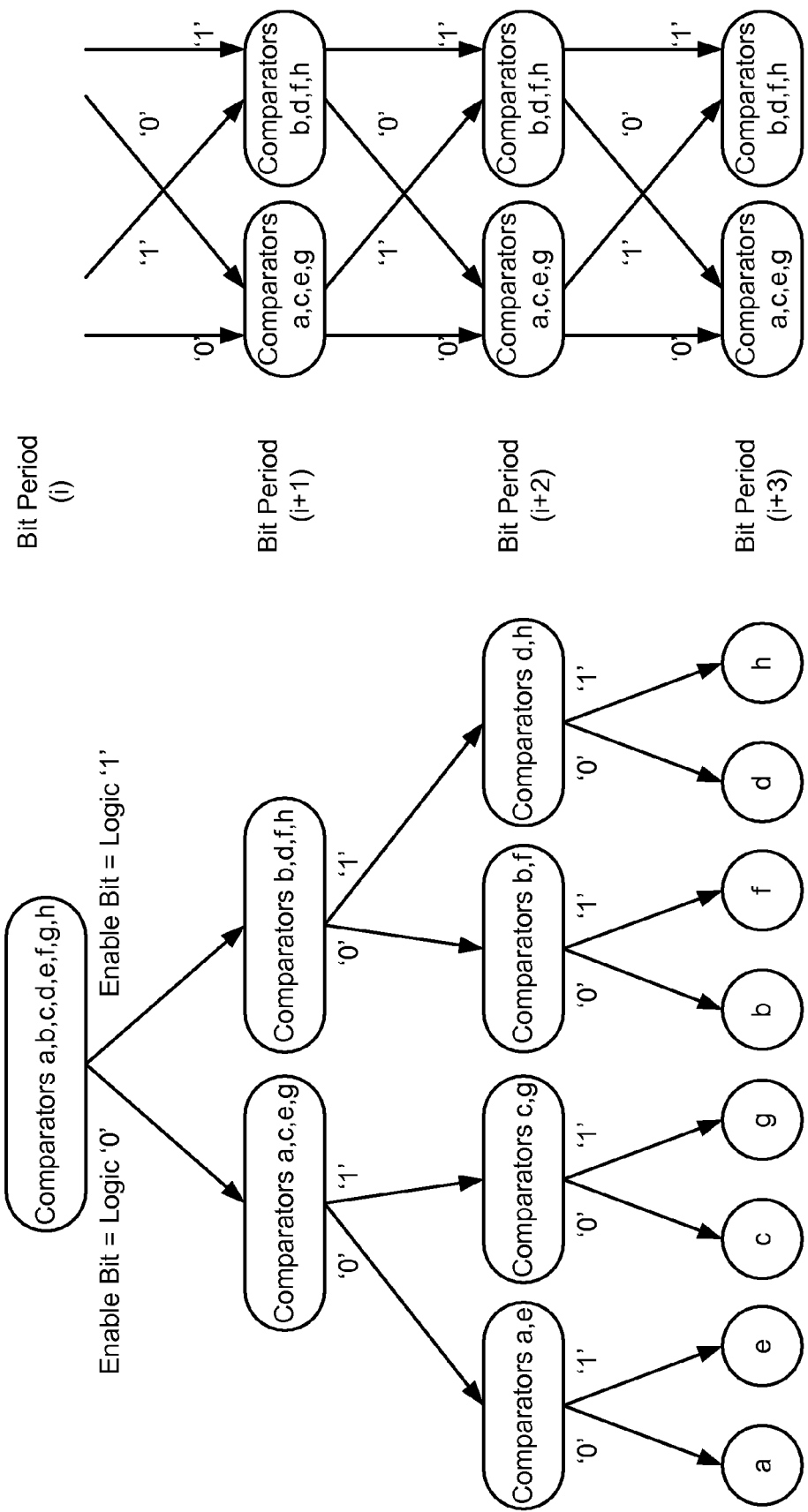
FIG. 11b is a flow diagram depicting the operation of the analog to digital converter of FIG. 11a across four consecutive bit periods.

Turning to FIG. 11b, a flow diagram depicts the operation of analog to digital converter 1100 across four consecutive bit periods (bit period (i), bit period (i+1), bit period (i+2), and bit period (i+3)). During bit period (i) the output of any comparator is eligible. During the subsequent bit period (bit period (i+1)), only comparators a, c, e, g are eligible where enable bit 1192 is a logic '0'. Where enable bit 1192 is a logic '0' only comparators a, c, e, g are clocked. In contrast, only comparators b, d, f, h are eligible where enable bit 1192 is a logic '1'. Where enable bit 1192 is a logic '1' only comparators b, d, f, h are clocked.

During the subsequent bit period (bit period (i+2)), only comparators a and e are eligible where enable bit 1192 is a logic '0' during the current bit period and where it was a logic '0' during the preceding bit period (bit period (i+1)). Alternatively, during bit period (i+2), only comparators c and g are eligible where enable bit 1192 is a logic '1' during the current bit period and where it was a logic '0' during the preceding bit period. As yet another alternative, during bit period (i+2), only comparators b and f are eligible where enable bit 1192 is a logic '0' during the current bit period and where it was a logic '1' during the preceding bit period. As yet another alternative, during bit period (i+2), only comparators d and h are eligible where enable bit 1192 is a logic '1' during the current bit period and where it was a logic '1' during the preceding bit period. During this same bit period, where enable bit 1192 is a logic '0' only comparators a, c, e, g are clocked, and where enable bit 1192 is a logic '1' only comparators b, d, f, h are clocked.

During the subsequent bit period (bit period (i+3)), only comparator a is eligible where enable bit 1192 is a logic '0' during the current bit period, and where it was a logic '0' during the preceding bit period (bit period (i+2)), and where it was a logic '0' two bit periods prior (bit period (i+1)). Alternatively, during bit period (i+3), only comparator e is eligible where enable bit 1192 is a logic '1' during the current bit period, and where it was a logic '0' during the preceding bit period (bit period (i+2)), and where it was a logic '0' two bit periods prior (bit period (i+1)). Alternatively, during bit period (i+3), only comparator c is eligible where enable bit 1192 is a logic '0' during the current bit period, and where it was a logic '1' during the preceding bit period (bit period (i+2)), and where it was a logic '0' two bit periods prior (bit period (i+1)). Alternatively, during bit period (i+3), only comparator g is eligible where enable bit 1192 is a logic '1' during the current bit period, and where it was a logic '1' during the preceding bit period (bit period (i+2)), and where it was a logic '0' two bit periods prior (bit period (i+1)). Alternatively, during bit period (i+3), only comparator b is eligible where enable bit 1192 is a logic '0' during the current bit period, and where it was a logic '0' during the preceding bit period (bit period (i+2)), and where it was a logic '1' two bit periods prior (bit period (i+1)). Alternatively, during bit period (i+3), only comparator f is eligible where enable bit 1192 is a logic '1' during the current bit period, and where it was a logic '0' during the preceding bit period (bit period (i+2)), and where it was a logic '1' two bit periods prior (bit period (i+1)). Alternatively, during bit period (i+3), only comparator d is eligible where enable bit 1192 is a logic '0' during the current bit period, and where it was a logic '1' during the preceding bit period (bit period (i+2)), and where it was a logic '1' two bit periods prior (bit period (i+1)). Finally, during bit period (i+3), only comparator h is eligible where enable bit 1192 is a logic '1' during the current bit period, and where it was a logic '1' during the preceding bit period (bit period (i+2)), and where it was a logic '1' two bit periods prior (bit period (i+1)). During this same bit period, where enable bit 1192 is a logic '0' only comparators a, c, e, g are clocked, and where enable bit 1192 is a logic '1' only comparators b, d, f, h are clocked.

Figure 12A:
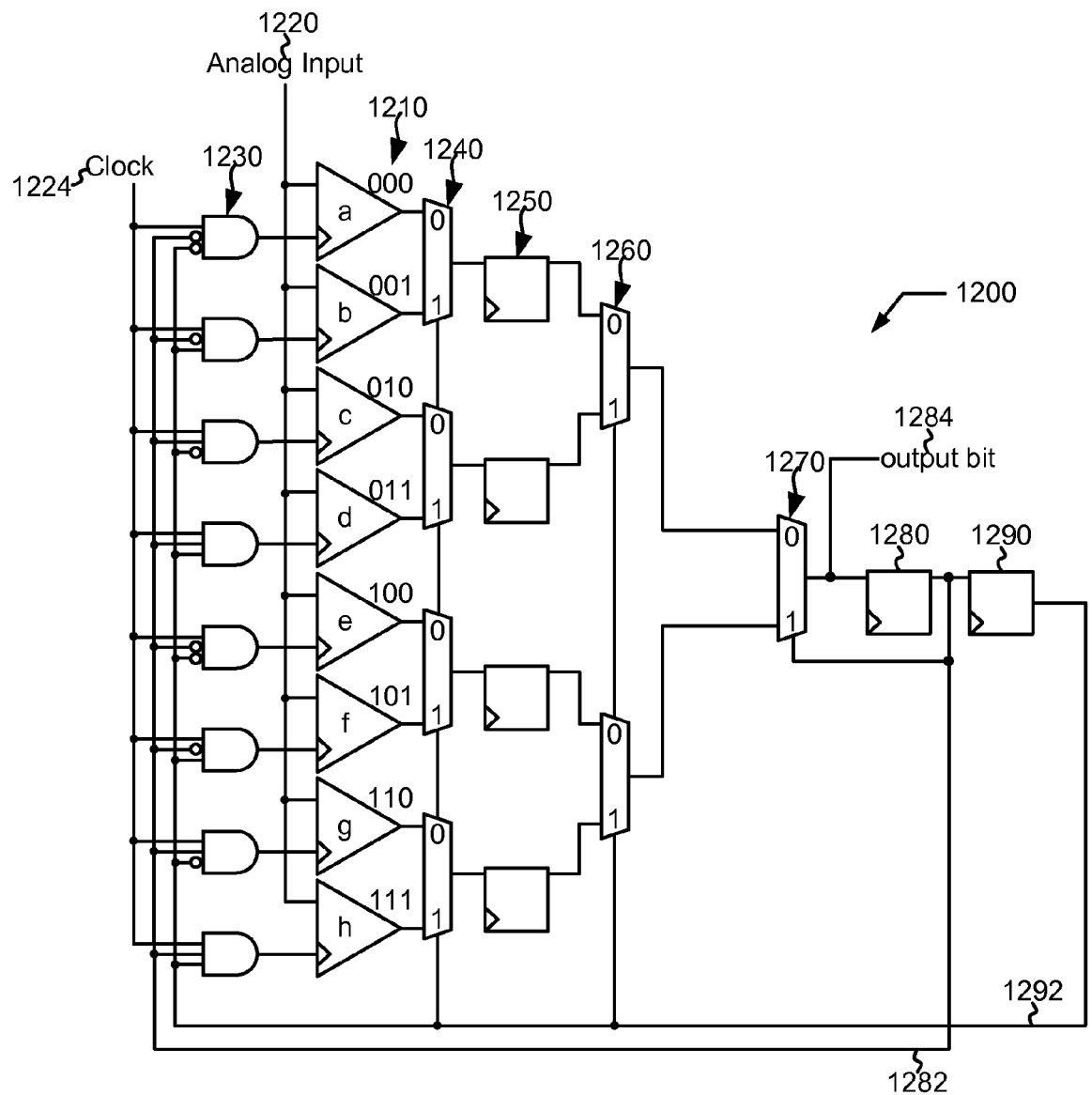
FIG. 12a depicts another analog to digital converter using a multiplexer tree implemented in synchronized combinatorial logic, and including power savings features in accordance with one or more embodiments of the present invention.

Turning to FIG. 12a, an analog to digital converter 1200 using a multiplexer tree implemented in synchronized combinatorial logic, and including power savings features is depicted in accordance with one or more embodiments of the present invention. Analog to digital converter 1200 includes a bank of eight comparators 1210 that each compare an analog input 1220 against respective reference voltages (not shown). In particular, a distinct reference voltage is provided to each of comparators 1210 with the reference voltages extending across the input range of analog to digital converter 1200. In some cases, the respective reference voltages are programmable such that the input range of analog to digital converter 1200 can be adjusted. Each of comparators 210 is clocked by a respective gated clock that is generated by a bank of AND gates 1230. Each of AND gates 1230 logically ANDs a clock input 1224 with a combination of an enable bit 1282 and an enable bit 1292. In particular, one quarter of comparators 1210 (i.e., comparators a, e) are clocked whenever enable bit 1282 and enable bit 1292 are both asserted low, and a clock input 1224 is asserted high. One quarter of comparators 1210 (i.e., comparators d, h) are clocked whenever enable bit 1282 and enable bit 1292 are both asserted high, and clock input 1224 is asserted high. One quarter of comparators 1210 (i.e., comparators b, f) are clocked whenever enable bit 1282 is asserted low, enable bit 1292 is asserted high, and clock input 1224 is asserted high. One quarter of comparators 1210 (i.e., comparators c, g) are clocked whenever enable bit 1282 is asserted high, enable bit 1292 is asserted low, and clock input 1224 is asserted high. In this way, power is only being dissipated by one quarter of comparators 1210 during any given bit period. As more fully discussed in the above mentioned reference that is incorporated herein by reference for all purposes, more enable bits may be generated by saving additional history information which can result in enabling a smaller percentage of comparators 1210, or fewer enable bits may be generated in which case a larger percentage of comparators 1210 may be clocked on any given clock cycle.

An output bit 1284 is equivalent to the output of one of comparators 1210 asserted one bit period prior, enable bit 1282 is equivalent to the output of one of comparators 1210 asserted two bit periods prior, and output bit 1292 is equivalent to the output of one of comparators 1210 asserted three bit periods prior, with all three being based on previous bit assertions as selected by a synchronized multiplexer tree comprising a first tier of multiplexers 1240, a first tier of flip-flops 1250, a second tier of multiplexers 1260, and a third tier multiplexer 1270. Enable bit 1282 is stored in a flip-flop 1280, and output bit 1292 is stored in a flip-flop 1290. Enable bits 1282, 1292 are provided to AND gates 1230 to enable clocking of a selected subset of comparators 1210. Further, enable bit 1292 drives the selector input of the multiplexers in first tier multiplexers 1240 and second tier multiplexers 1260. Enable bit 1282 drives the selector input of third tier multiplexer 1280.

Figure 12B:
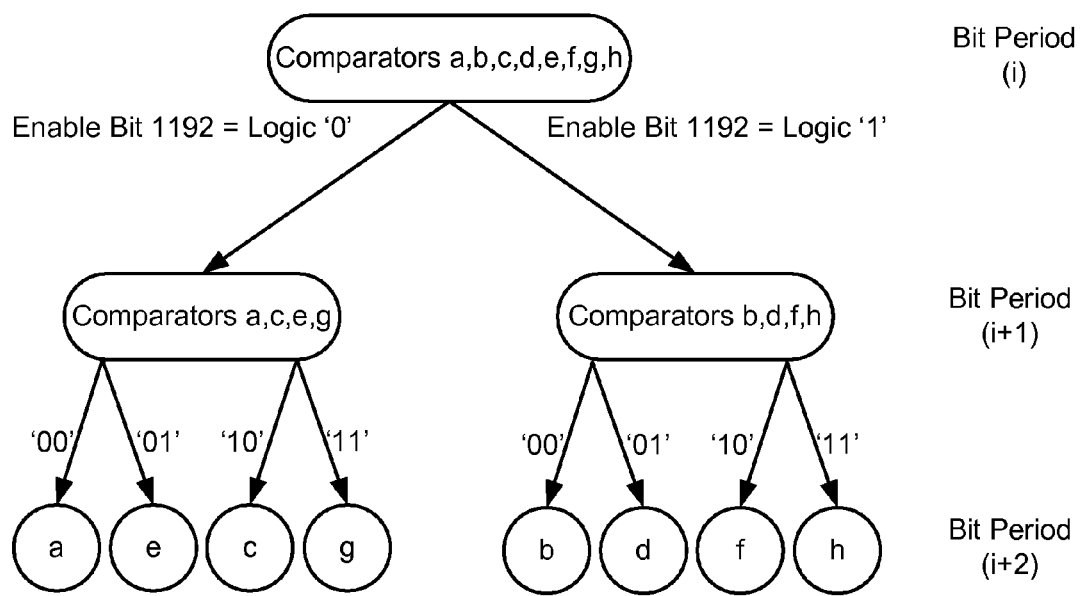
FIG. 12b is a flow diagram depicting the operation of the analog to digital converter of FIG. 12a across three consecutive bit periods.

Turning to FIG. 12b, a flow diagram depicts the operation of analog to digital converter 1200 across three consecutive bit periods (bit period (i), bit period (i+1), and bit period (i+2)). During bit period (i) the output of any comparator is eligible. During the subsequent bit period (bit period (i+1)), only comparators a, c, e, g are eligible where enable bit 1292 is a logic '0'. During the subsequent bit period (bit period (i+2)), a final comparator is selected based on a combination of enable bit 1282 and enable bit 1292. Where enable bit 1282 is a logic '0' and enable bit 1292 is a logic '0', comparator a is selected; where enable bit 1282 is a logic '1' and enable bit 1292 is a logic '0', comparator e is selected; where enable bit 1282 is a logic '1' and enable bit 1292 is a logic '1', comparator g is selected; and where enable bit 1282 is a logic '0' and enable bit 1292 is a logic '1', comparator c is selected. Alternatively, during the subsequent bit period (bit period (i+1)), only comparators b, d, f, h are eligible where enable bit 1292 is a logic '1'. During the subsequent bit period (bit period (i+2)), a final comparator is selected based on a combination of enable bit 1282 and enable bit 1292. Where enable bit 1282 is a logic '0' and enable bit 1292 is a logic '0', comparator b is selected; where enable bit 1282 is a logic '1' and enable bit 1292 is a logic '0', comparator d is selected; where enable bit 1282 is a logic '1' and enable bit 1292 is a logic '1', comparator h is selected; and where enable bit 1282 is a logic '0' and enable bit 1292 is a logic '1', comparator f is selected.

When enable bit 1282 is a logic '0' and enable bit 1292 is a logic '0', only comparators a and e are clocked. When enable bit 1282 is a logic '0' and enable bit 1292 is a logic '1', only comparators b and f are clocked. When enable bit 1282 is a logic '1' and enable bit 1292 is a logic '0', only comparators c and g are clocked. When enable bit 1182 is a logic '1' and enable bit 1192 is a logic '1', only comparators d and h are clocked.

Based on the disclosure provided herein, one of ordinary skill in the art will recognize that a pipelined analog to digital converter may be implemented with a desired balance between critical path minimization and power minimization. Where power minimization is key, the number of known bits may be increased to decrease the number of comparators being clocked on any give clock cycle. In contrast, where critical path minimization is desired, the number of pipeline stages may be increased to reduce the levels of combinational logic traversed between clock cycles.

Figure 13:
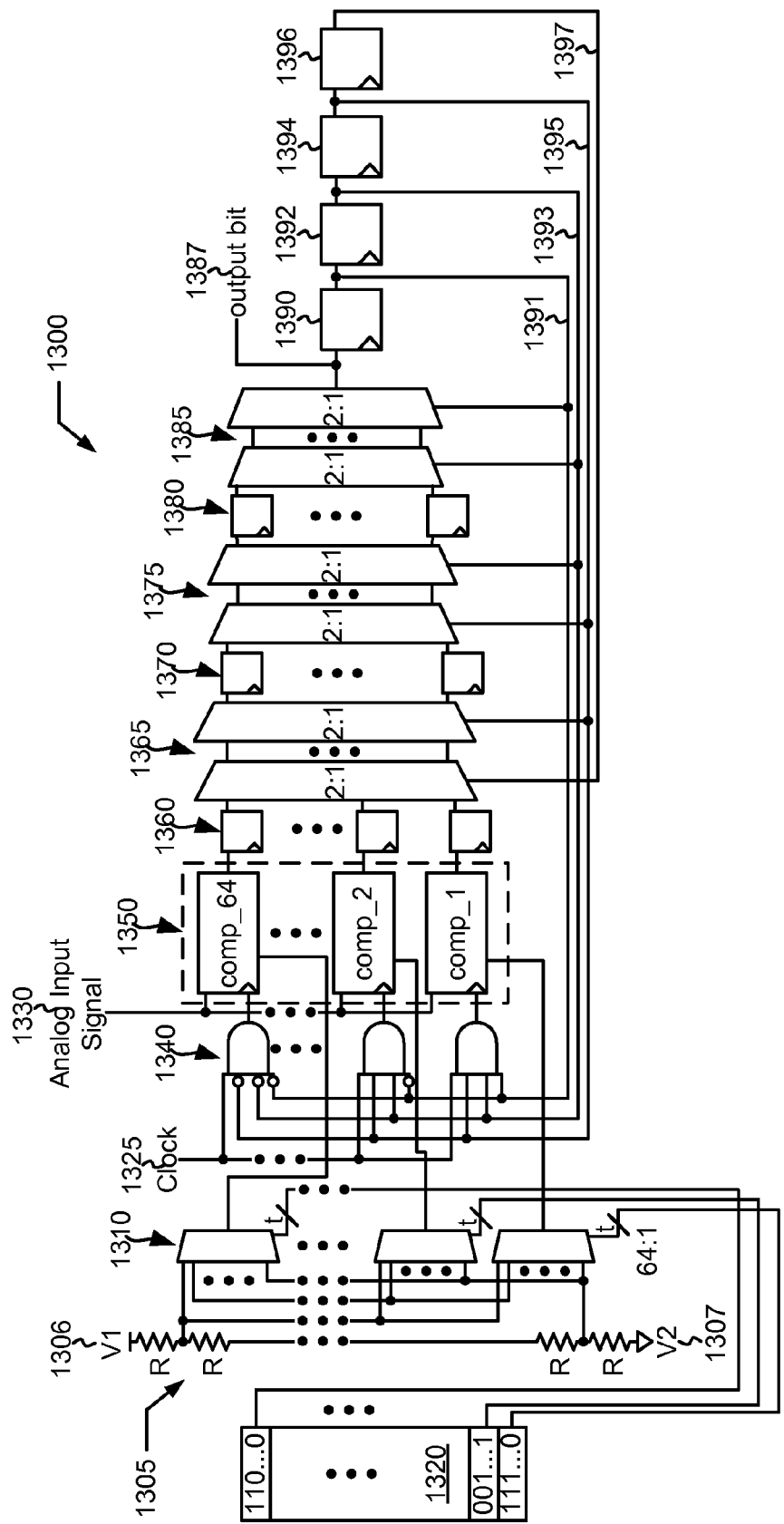
FIG. 13 depicts another analog to digital converter where three known bits are used to disable fifty-six of sixty-four comparators in accordance with some embodiments of the present invention.

As an example of how the principles of the invention can be expanded, FIG. 13 depicts an analog to digital converter 1300 that utilizes a reasonable level of pipelining to reduce the critical path, and uses three known bits that allows for disabling fifty-six of a total sixty four comparators during any given clock cycle. Analog to digital converter 1300 includes a bank of sixty-four comparators 1350 that each compare an analog input 1330 against respective reference voltages that are provided by respective ones of sixty-four analog multiplexers 1310. Analog multiplexers 1310 each receives a number of reference voltages generated by a resistor chain 1305 extending between a lower voltage 1307 and an upper voltage 1306. The input range of analog to digital converter 1300 may be modified by programmably addressing a different input range selection from a lookup table 1320. The output from lookup table 1320 drives the selector inputs of analog multiplexers 1310. Each of comparators 1350 are clocked by a respective gated clock that is generated by a bank of sixty-four AND gates 1340. In particular, one eighth of comparators 1350 are clocked on any given cycle of clock 1325. This reduces power dissipation when compared with other circuits where all or more than one eighth of the comparators are clocked on a given clock cycle.

The output of comparators 1350 are stored in sixty-four flip-flops 1360. A selection between the outputs of flip-flops 1360 is made by a two tier multiplexer 1365. The output of multiplexer 1365 is stored in sixteen flip-flops 1370. A selection between the outputs of flip-flops 1370 is made by a two tier multiplexer 1375. The output of multiplexer 1375 is stored in four flip-flops 1380. A selection between the outputs of flip-flops 1380 is made by a two tier multiplexer 1385. An output bit 1387 is provided by multiplexer 1385. Output bit 1387 is provided to a shift register formed of a series of flip-flops 1390, 1392, 1394, 1396 that provide enable bits 1391, 1393, 1395, 1397 to control the clock gating via AND gates 1340, and the output selection via multiplexers 1365, 1375, 1385.

Figure 1:
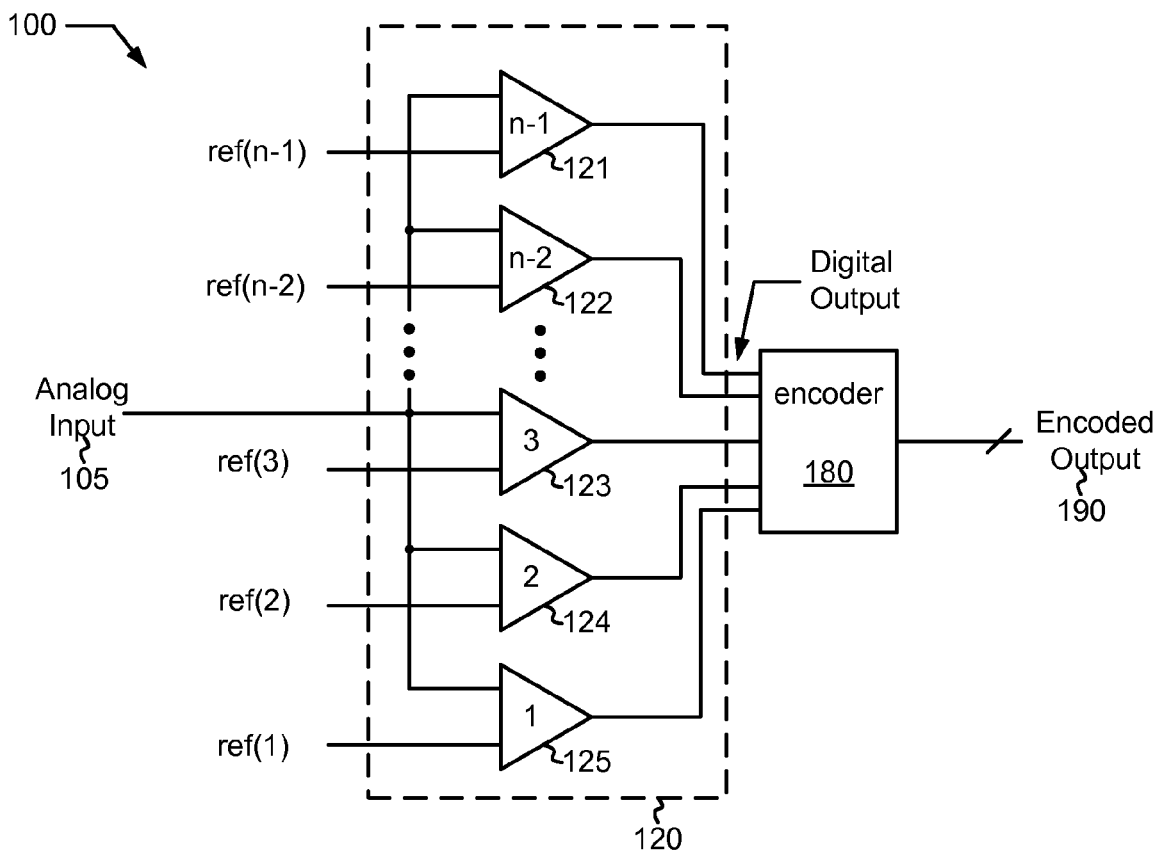
FIG. 1 depicts a prior art flash analog to digital converter.
Figure 14:
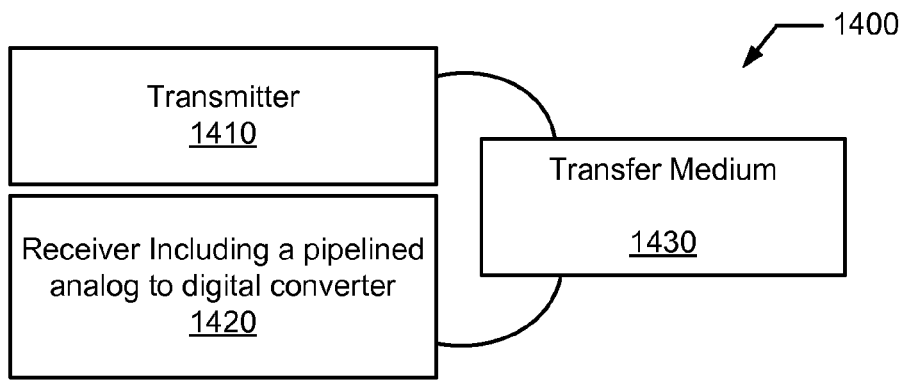
FIG. 14 depicts a communication system including a pipelined analog to digital converter in accordance with some embodiments of the present invention.

Turning to FIG. 14, a communication system 1400 including a receiver 1420 with a pipelined analog to digital converter is shown in accordance with some embodiments of the present invention. Communication system 1400 includes a transmitter 1410 that transmits a signal representing a data set to receiver 1420 via a transfer medium 1430. Transfer medium 1430 may be, but is not limited to, a wireless transfer medium, a electrically wired transfer medium, a magnetic storage medium, or an optical transfer medium. Based on the disclosure provided herein, one of ordinary skill in the art will recognize a variety of transfer media that may be used in relation to different embodiments of the present invention. Receiver 1420 includes a pipelined analog to digital converter similar to those described above in relation to FIGS. 7, 8, 9, 10a, 10b, 11a, 12a, and 13. In some cases, communication system 1400 may be a cellular telephone system with transmitter 1410 and receiver 1420 being cell phones and/or cell towers. Alternatively, communication system 1400 may be a magnetic storage medium with transmitter 1410 being a write function, transfer medium 1430 being a magnetic storage medium, and receiver 1420 being a read function. Based on the disclosure provided herein, one of ordinary skill in the art will recognize a variety of other systems that may be represented as communication system 1400 in accordance with different embodiments of the present invention.

In conclusion, the invention provides novel systems, devices, methods and arrangements for analog to digital conversion. While detailed descriptions of one or more embodiments of the invention have been given above, various alternatives, modifications, and equivalents will be apparent to those skilled in the art without varying from the spirit of the invention. For example, while different embodiments of the present invention have been depicted with a particular number of taps and/or levels of interleaving, it will be understood that an arbitrary number of taps and/or interleaves may be supported in accordance with different embodiments of the present invention. Therefore, the above description should not be taken as limiting the scope of the invention, which is defined by the appended claims.

What is claimed is:

1. A pipelined analog to digital converter circuit, the circuit comprising:
   a first comparator, wherein the first comparator is operable to compare an analog input to a first voltage reference upon assertion of the first clock;
   a second comparator, wherein the second comparator is operable to compare the analog input to a second voltage reference upon assertion of the second clock;
   a multiplexer tree, wherein the multiplexer tree includes at least a first tier multiplexer and a second tier multiplexer, wherein the first tier multiplexer receives an output of the first comparator and an output of the second comparator, wherein the second tier multiplexer receives an output derived from the first tier multiplexer, and wherein the second tier multiplexer provides an output bit;
   a bit enable set, wherein the bit enable set receives the output bit; and
   wherein the bit enable set is used as a selector input to the first tier multiplexer and the second tier multiplexer.

2. The circuit of claim 1, wherein the bit enable set is used to gate at least one of the first clock and the second clock.

3. The circuit of claim 1, wherein the first clock and the second clock are the same clock, and wherein the first comparator and the second comparator are enabled on all bit periods.

4. The circuit of claim 1, wherein the first reference voltage and the second reference voltage are programmable.

5. The circuit of claim 1, wherein the bit enable set is received from individual flip-flop outputs of a shift register, and wherein an initial flip-flop in the shift register receives the output bit.

6. The circuit of claim 1, wherein an output of the first tier multiplexer is registered to generate a registered value, and wherein the output derived from the first tier multiplexer is derived from the registered value.

7. The circuit of claim 6, wherein the bit enable set includes a first bit enable and a second bit enable, and wherein the first bit enable is provided as a selector input to the first tier multiplexer, and wherein the second bit enable is provided as a selector input to the second tier multiplexer.

8. The circuit of claim 7, wherein both the first bit enable and the second bit enable are used to gate both the first clock and the second clock.

9. The circuit of claim 8, wherein the first comparator and the second comparator are two of a number of comparators, wherein the first clock and the second clock are derived from an input clock, and wherein only one half of the number of comparators are enabled on any given cycle of the input clock.

10. The circuit of claim 8, wherein the first comparator and the second comparator are two of a number of comparators, wherein the first clock and the second clock are derived from an input clock, and wherein only one quarter of the number of comparators are enabled on any given cycle of the input clock.

11. The circuit of claim 8, wherein the first comparator and the second comparator are two of a number of comparators, wherein the first clock and the second clock are derived from an input clock, and wherein less than one quarter of the number of comparators are enabled on any given cycle of the input clock.

12. The circuit of claim 1, wherein the first tier multiplexer is a first multi-tier multiplexer, and wherein the second tier multiplexer is a second multi-tier multiplexer.

13. A communication system, the system comprising:
a receiver including an analog to digital converter, wherein the analog to digital converter includes:
a first comparator, wherein the first comparator is operable to compare an analog input to a first voltage reference upon assertion of the first clock;
a second comparator, wherein the second comparator is operable to compare the analog input to a second voltage reference upon assertion of the second clock;
a multiplexer tree, wherein the multiplexer tree includes at least a first tier multiplexer and a second tier multiplexer, wherein the first tier multiplexer receives an output of the first comparator and an output of the second comparator, wherein the second tier multiplexer receives an output derived from the first tier multiplexer, and wherein the second tier multiplexer provides an output bit;
a bit enable set, wherein the bit enable set receives the output bit; and
wherein the bit enable set is used as a selector input to the first tier multiplexer and the second tier multiplexer.

14. The communication system of claim 13, wherein the communication system further includes a transmitter, and wherein the transmitter transmits information to the receiver via a medium.

15. The communication system of claim 14, wherein the communication system is a hard disk drive system, and wherein the medium is a storage medium.

16. The communication system of claim 14, wherein the communication system is a wireless communication system, and wherein the medium is a wireless medium.

17. A method for analog to digital conversion, the method comprising:
providing a plurality of comparators, wherein each of the plurality of comparators receives an analog input signal and a respective reference voltage;
receiving the analog input signal;
selecting an output bit of a respective one of the plurality of comparators using a synchronized multiplexer tree, wherein the synchronized multiplexer tree includes at least a first tier multiplexer and a second tier multiplexer, wherein the first tier multiplexer receives outputs from each of the plurality of comparators, wherein a register receives outputs from the first tier multiplexer, wherein the second tier multiplexer receives an output derived from the register, and wherein the second tier multiplexer provides the output bit for a current bit period; and
selecting the output bit based at least in part on the output bit from a preceding bit period.

18. The method of claim 17, wherein the output bit from the preceding bit period is used to enable a subset of the plurality of comparators.

19. The method of claim 18, wherein the subset of the plurality of comparators is selected from a group consisting of: one half of the subset of comparators, one quarter of the subset of comparators, and less than one quarter of the subset of comparators.

20. The method of claim 17, wherein the first tier multiplexer is a first multi-tier multiplexer, and wherein the second tier multiplexer is a second multi-tier multiplexer.

* * * * *